United States Patent
Christophersen et al.

(10) Patent No.: US 10,345,384 B2
(45) Date of Patent: Jul. 9, 2019

(54) DEVICE, SYSTEM, AND METHOD FOR MEASURING INTERNAL IMPEDANCE OF A TEST BATTERY USING FREQUENCY RESPONSE

(71) Applicant: BATTELLE ENERGY ALLIANCE, LLC, Idaho Falls, ID (US)

(72) Inventors: Jon P Christophersen, Moscow, ID (US); William H Morrison, Butte, MT (US); John L Morrison, Butte, MT (US)

(73) Assignee: BATTELLE ENERGY ALLIANCE, LLC, Idaho Falls, ID (US)

( * ) Notice: Subject to any disclaimer, the term of this patent is extended or adjusted under 35 U.S.C. 154(b) by 586 days.

(21) Appl. No.: 15/060,183

(22) Filed: Mar. 3, 2016

(65) Prior Publication Data
US 2017/0254859 A1    Sep. 7, 2017

(51) Int. Cl.
*G01R 31/36* (2006.01)

(52) U.S. Cl.
CPC ..... *G01R 31/3662* (2013.01); *G01R 31/3679* (2013.01)

(58) Field of Classification Search
CPC .................. G01R 31/3662; G01R 31/3679
See application file for complete search history.

(56) References Cited

U.S. PATENT DOCUMENTS

| 4,498,044 A | 2/1985 | Horn |
| 4,697,134 A | 9/1987 | Burkum et al. |
| 5,061,890 A | 10/1991 | Longini et al. |
| 5,261,007 A | 11/1993 | Hirsch |

(Continued)

FOREIGN PATENT DOCUMENTS

| EP | 2447728 B1 | 6/2013 |
| JP | 2000009817 A | 1/2000 |

(Continued)

OTHER PUBLICATIONS

Morrison, William H., Development and Implementation of a Calibration Procedure for Complex Impedance Spectrum Measurements with Applications to Embedded Battery Health Monitoring and Management Systems, Master's Thesis, 2012.*

(Continued)

*Primary Examiner* — Daniel R Miller
(74) *Attorney, Agent, or Firm* — TraskBritt

(57) ABSTRACT

Battery impedance testing devices, circuits, systems, and related methods are disclosed. An impedance measurement device includes a current driver configured to generate an excitation current signal to be applied to a test battery responsive to a control signal, and a processor operably coupled with the current driver. The processor is configured to generate the control signal during an auto-ranging mode and a measuring mode. The auto-ranging mode applies the excitation current signal to the test battery over a plurality of different amplitudes to measure a response to the excitation current signal at each amplitude. The measuring mode applies the excitation current signal to the test battery for an amplitude responsive to the results of the auto-ranging mode. Improved sensitivity and resolution may be achieved for low impedance batteries with a rapid measurement time.

26 Claims, 6 Drawing Sheets

(56) References Cited

U.S. PATENT DOCUMENTS

| | | |
|---|---|---|
| 5,281,920 A | 1/1994 | Wurst |
| 5,406,496 A | 4/1995 | Quinn |
| 5,454,377 A | 10/1995 | Dzwonczyk et al. |
| 5,457,377 A | 10/1995 | Jonsson et al. |
| 5,512,832 A | 4/1996 | Russell |
| 5,946,482 A | 8/1999 | Barford et al. |
| 5,969,625 A | 10/1999 | Russo et al. |
| 6,002,238 A | 12/1999 | Champlin |
| 6,072,299 A | 6/2000 | Kurle et al. |
| 6,160,382 A | 12/2000 | Yoon et al. |
| 6,208,147 B1 | 3/2001 | Yoon et al. |
| 6,222,369 B1 | 4/2001 | Champlin |
| 6,249,186 B1 | 6/2001 | Ebihara et al. |
| 6,262,563 B1 | 7/2001 | Champlin |
| 6,307,378 B1 | 10/2001 | Kozlowski |
| 6,313,607 B1 | 11/2001 | Champlin |
| 6,330,933 B1 | 12/2001 | Boeckman et al. |
| 6,472,847 B2 | 10/2002 | Lundberg |
| 6,481,289 B2 | 11/2002 | Dixon et al. |
| 6,519,539 B1 | 2/2003 | Freeman et al. |
| 6,653,817 B2 | 11/2003 | Tate, Jr. et al. |
| 6,691,095 B2 | 2/2004 | Singh et al. |
| 6,778,913 B2 | 8/2004 | Tinnemeyer |
| 6,816,797 B2 | 11/2004 | Freeman et al. |
| 6,832,171 B2 | 12/2004 | Barsoukov et al. |
| 6,876,174 B1 | 4/2005 | Samittier Marti et al. |
| 7,019,542 B2 | 3/2006 | Tinnemeyer |
| 7,051,008 B2 | 5/2006 | Singh et al. |
| 7,065,474 B2 | 6/2006 | Petchenev et al. |
| 7,072,871 B1 | 7/2006 | Tinnemeyer |
| 7,395,163 B1 | 7/2008 | Morrison et al. |
| 7,616,003 B2 | 11/2009 | Satoh et al. |
| 7,675,293 B2 | 3/2010 | Christophersen et al. |
| 7,698,078 B2 | 4/2010 | Kelty et al. |
| 7,898,263 B2 | 3/2011 | Ishida et al. |
| 8,035,396 B2 | 10/2011 | Kim |
| 8,150,643 B1 | 4/2012 | Morrison et al. |
| 8,193,771 B2 | 6/2012 | Coccio |
| 8,332,342 B1 | 12/2012 | Saha et al. |
| 8,352,204 B2 | 1/2013 | Morrison et al. |
| 8,368,357 B2 | 2/2013 | Ghantous et al. |
| 8,415,926 B2 | 4/2013 | Bhardwaj et al. |
| 8,427,112 B2 | 4/2013 | Ghantous et al. |
| 8,447,544 B2 | 5/2013 | Hsu et al. |
| 8,467,984 B2 | 6/2013 | Gering |
| 8,487,628 B2 | 7/2013 | Sciarretta et al. |
| 8,513,921 B2 | 8/2013 | Berkowitz et al. |
| 8,521,497 B2 | 8/2013 | Gering |
| 8,532,945 B2 | 9/2013 | Sciarretta et al. |
| 8,548,762 B2 | 10/2013 | Prada et al. |
| 8,582,675 B1 | 11/2013 | Harris |
| 8,598,849 B2 | 12/2013 | Bhardwaj et al. |
| 8,638,070 B2 | 1/2014 | Maluf et al. |
| 8,648,602 B2 | 2/2014 | van Lammeren |
| 8,680,868 B2 | 3/2014 | van Lammeren et al. |
| 8,710,847 B2 | 4/2014 | Marvin et al. |
| 8,725,456 B1 | 5/2014 | Saha et al. |
| 8,738,310 B2 | 5/2014 | Swanton |
| 8,738,311 B2 | 5/2014 | Wu |
| 8,762,109 B2 | 6/2014 | Christophersen et al. |
| 8,773,145 B2 | 7/2014 | Phlippoteau et al. |
| 8,791,669 B2 | 7/2014 | Ghantous et al. |
| 8,831,897 B2 | 9/2014 | McHardy |
| 8,838,401 B2 | 9/2014 | Kelly |
| 8,849,598 B2 | 9/2014 | Mingant et al. |
| 8,868,363 B2 | 10/2014 | Morrison et al. |
| 8,889,309 B2 | 11/2014 | Manabe et al. |
| 8,901,886 B2 | 12/2014 | Berkowitz et al. |
| 8,907,631 B1 | 12/2014 | Gurries et al. |
| 8,907,675 B2 | 12/2014 | Phlippoteau et al. |
| 8,952,823 B2 | 2/2015 | Xie et al. |
| 8,970,178 B2 | 3/2015 | Berkowitz et al. |
| 8,975,874 B2 | 3/2015 | Berkowitz et al. |
| 9,030,173 B2 | 5/2015 | McHardy et al. |
| 9,035,621 B2 | 5/2015 | Berkowitz et al. |
| 9,035,623 B1 | 5/2015 | Berkowitz et al. |
| 9,063,018 B1 | 6/2015 | Ghantous et al. |
| 9,121,910 B2 | 9/2015 | Maluf et al. |
| 9,142,994 B2 | 9/2015 | Berkowitz et al. |
| 9,207,285 B1 | 12/2015 | Swanton et al. |
| 9,252,465 B2 | 2/2016 | Hariharan |
| 9,312,577 B2 | 4/2016 | Jamison |
| 9,373,972 B2 | 6/2016 | Ghantous et al. |
| 9,385,555 B2 | 7/2016 | Ghantous et al. |
| 9,461,492 B1 | 10/2016 | Berkowitz et al. |
| 9,465,077 B2 | 10/2016 | Love et al. |
| 9,519,031 B2 | 12/2016 | Jamison |
| 9,851,414 B2 | 12/2017 | Morrison et al. |
| 2002/0065621 A1 | 5/2002 | Jungerman |
| 2003/0184307 A1 | 10/2003 | Kozlowski et al. |
| 2003/0206021 A1 | 11/2003 | Laletin et al. |
| 2004/0095249 A1 | 5/2004 | Zaccaria |
| 2004/0162683 A1 | 8/2004 | Verbrugge et al. |
| 2005/0127908 A1 | 6/2005 | Schlicker et al. |
| 2005/0182584 A1 | 8/2005 | Plusquellic |
| 2006/0111854 A1 | 5/2006 | Plett |
| 2006/0111870 A1 | 5/2006 | Plett |
| 2006/0170397 A1 | 8/2006 | Srinivasan et al. |
| 2006/0284617 A1 | 12/2006 | Kozlowski et al. |
| 2006/0284618 A1 | 12/2006 | Cho et al. |
| 2007/0172708 A1 | 7/2007 | Takebe et al. |
| 2007/0182371 A1* | 8/2007 | Boebel .............. H01M 2/20 320/112 |
| 2007/0257681 A1 | 11/2007 | Christophersen et al. |
| 2008/0303528 A1 | 12/2008 | Kim |
| 2009/0076752 A1 | 3/2009 | Wang et al. |
| 2009/0278037 A1 | 11/2009 | Grothe |
| 2010/0010762 A1 | 1/2010 | Seki |
| 2010/0201320 A1 | 8/2010 | Coe et al. |
| 2010/0274510 A1 | 10/2010 | Morrison et al. |
| 2010/0332165 A1 | 12/2010 | Morrison et al. |
| 2011/0018543 A1* | 1/2011 | Bos .............. G01N 17/02 324/444 |
| 2011/0077880 A1 | 3/2011 | Gering |
| 2011/0270559 A1 | 11/2011 | Christophersen et al. |
| 2011/0301931 A1 | 12/2011 | Gering |
| 2012/0019253 A1 | 1/2012 | Ziegler et al. |
| 2012/0032688 A1 | 2/2012 | Christophersen et al. |
| 2012/0038452 A1 | 2/2012 | Phlippoteau et al. |
| 2012/0078552 A1 | 3/2012 | Mingant et al. |
| 2012/0105070 A1 | 5/2012 | van Lammeren et al. |
| 2012/0188086 A1 | 7/2012 | Xie et al. |
| 2012/0262186 A1 | 10/2012 | Morrison et al. |
| 2012/0316815 A1 | 12/2012 | Morigaki |
| 2013/0002267 A1 | 1/2013 | Kothandaraman et al. |
| 2013/0069660 A1 | 3/2013 | Bernard et al. |
| 2013/0141109 A1 | 6/2013 | Love et al. |
| 2013/0229156 A1 | 9/2013 | Brandon et al. |
| 2013/0267943 A1 | 10/2013 | Hancock |
| 2014/0125284 A1 | 5/2014 | Qahouq |
| 2014/0188414 A1 | 7/2014 | Jeong et al. |
| 2014/0358462 A1 | 12/2014 | Christophersen et al. |
| 2014/0372054 A1 | 12/2014 | Wang et al. |
| 2014/0372055 A1 | 12/2014 | Wang et al. |
| 2015/0002105 A1 | 1/2015 | Kelly |
| 2015/0165921 A1 | 6/2015 | Paryani |
| 2015/0168500 A1 | 6/2015 | Jamison |
| 2015/0197159 A1 | 7/2015 | Lee |
| 2017/0254859 A1 | 9/2017 | Christophersen et al. |
| 2018/0143257 A1 | 5/2018 | Garcia et al. |

FOREIGN PATENT DOCUMENTS

| | | |
|---|---|---|
| JP | 2003-090869 A | 3/2003 |
| JP | 2003-223918 A | 8/2003 |
| JP | 2011-174925 A | 9/2011 |
| JP | 2015-078992 A | 4/2015 |
| WO | 2004106946 A2 | 12/2004 |
| WO | 2010144834 A2 | 12/2010 |
| WO | 2010144857 A2 | 12/2010 |
| WO | 2011041094 A1 | 4/2011 |
| WO | 2011140123 A1 | 11/2011 |
| WO | 2011140131 A1 | 11/2011 |
| WO | 2013085996 A1 | 6/2013 |

(56) References Cited

FOREIGN PATENT DOCUMENTS

| WO | 2014070831 A1 | 5/2014 |
|---|---|---|
| WO | 2015029647 A1 | 3/2015 |
| WO | 2016012922 A1 | 1/2016 |

OTHER PUBLICATIONS

Hirschorn, On Selection of the Perturbation Amplitude Required to Avoid Nonlinear Effects in Impedance Measurements, Israel Journal of Chemistry, vol. 48, 2008.*
Ford, Validation of Push Pull Current, Proceedings of the Annual Montana Tech Electrical and General Engineering Symposium, Jan. 2016.*
Aglzim et al., "Characterization of the Resistance of a Fuel Cell on Load by Electrochemical Impedance Spectroscopy", Proceedings from the EUROCON Conference, IEEE (2007) pp. 1489-1492.
Ashtiani, Cyrus N., "Battery Hazard Modes and Risk Mitigation Analysis", USABC Version 0.0 (Aug. 2007) 10 pages.
Baert et al., "Determination of the State-of-Health of VRLA Batteries by Means of Noise Measurements", IEEE (downloaded Feb. 2010) pp. 301-306.
Banaei et al., "Online Detection of terminal voltage in Li-ion Batteries via Battery Impulse Response", IEEE (2009) pp. 194-198.
"Battery Calendar Life Estimatory Manual, Modeling and Simulation", U.S. Department of Energy Vehicle Technologie Program, Revision 1, INL-EXT-08-15136, (Oct. 2012), 84 pages.
"Battery Test Manual for Plug-In Hybrid Electric Vehicles", U.S. Department of Energy Vehicle Technologies Program, INL/EXT-14-32849, Revision 3 (Sep. 2014) 82 pages.
"Battery Test Manual for 38 Volt Mild Hybrid Electric Vehicles", U.S. Department of Energy Vehicle Technologies Program, INL/EXT-15-36567, Revision 0 (Mar. 2017) 70 pages.
"Battery Test Manual for 12 Volt Start/Stop Vehicles", U.S. Department of Energy Vehicle Technologies Program, INL/EXT-12-26503, Revision 1 (May 2015) 67 pages.
"Battery Test Manual for Electric Vehicles", U.S. Department of Energy Vehicle Technologies Program, INL/EXT-15-34184, Revision 3 (Jun. 2015) 67 pages.
Blanke et al., "Impedance measurements on lead-acid batteries for state-of-charge, state-of-health and cranking capability prognosis in electric and hybrid electric venicles", Journal of Power Sources, 144 (2005) pp. 418-425.
Blidberg, Andreas, "Correlation between different impedance measurement methods for battery cells", KTH chemical Science and Engineering (2012) 42 pages.
Bloom et al., "An Investigation of the Impedance Rise and Power Fade in High-Power Li-Ion Cells", presented at the 19th Inernational Electric Vehicle Symposium (EVS-19) (Oct. 2002) 14, pages.
Bohlen et al., "Impedance Based Battery Diagnosis for Automotive Applications", 35th Annual IEEE Power Electronics Specialists Conference (2004) pp. 2192-2797.
Bose et al., "Lessons Learned in Using OHMIC Techniques for Battery Monitoring", IEEE (2001) pp. 99-104.
Christensen et al., "Using on-board Electrochemical Impedance Spectroscopy in Battery Management Systems", World Electric Vehicle Journal, vol. 6—ISSN 2032-6653 (2013) pp. 0793-0799.
Christophersen et al., "Advanced Technology Development Program for Lithium-Ion Batteries: Gen 2 Performance Evaluation Final Report", FreedomCAR & Vehicle Technoliges Program, INL/EXT-05-00913 (Jul. 2006) 140 pages.
Christophersen et al., "Battery Technology Life Verification Testing and Analysis", Idaho National Laboratory INL/CON-07-12282 (Dec. 2007) 12 pages.
Christophersen et al., "Performance Evaluation of Gen3 Advanced Technology Development Cells", 214th ECE Meeting, Abstract #549, The Electrochemical Society, (2008), 1 page.
Christophersen et al., "Pulse resistance effects due to charging or discharging of high-power lithium-ion cells: A path dependence study", Journal of Power Sources, 173 (2007) pp. 998-1005.

Cox et al., "Battery State of Health Monitoring, Combining Conductance Technology with Other Measurement Parameters for Real-Time Battery Performance Analysis", IEEE, 19-2 (2000) pp. 342-347.
Crow et al., "Integrated Prognostic Health Monitoring of Battery Health in Ground Robots", PennState Applied Research Laboratory, 32nd Association for Unmanned Vehicle Systems International Meeting (Jun. 2005) 16 pages.
Delaille et al., "Study of the 'coup de fouet' of lead-acid cells as a function of their state-of-charge and state-of-health", Journal of Power Sources, 158 (2006) pp. 1019-1028.
Diard et al., "Constant load vs constant current EIS study of electrochemical battery discharge", Electrochimica Acta, vol. 42, Nos. 23-24 (1997) pp. 3417-3420.
Diard et al., "EIS study of electrochemical battery discharge on constant load", Journal of Power Sources, 70 (1998) pp. 78-84.
Diard et al., "Impedance measurements of polymer electrolyte membrane fuel cells running on constant load", Journal of Power Sources, 74 (1998) pp. 244-245.
Donnellan et al., "Impedance Noise Identification", (May 2008) 72 pages.
Doughty et al., "Electrical Energy Storage System Abuse Test Manual for Electric and Hybrid Electric Vehicle Applications", FreedomCAR, SAND2005-3123 (Jun. 2005) 46 pages.
"FreedomCAR Ultracapacitor Test Manual", Idaho National Laboratory, DOE/ID-11173, Revision 0 (Sep. 2004) 116 pages.
Gould et al., "New Battery Model and State-of-Health Determination Through Subspace Parameter Estimation and State-Observer Techniques", IEEE Transactions on Vehicular Technology, vol. 58, No. 8 (Oct. 2009) pp. 3905-3916.
Hariprakash et al, "Monitoring sealed automotive lead-acid batteries by sparse-impedance spectroscopy", Proc. Indian Acad. Sci. (Chem. Sci.), vol. 115, Nos. 5&6 (Oct.-Dec. 2003) pp. 465-472.
Hariprakash et al., "On-line monitoring of lead-acid batteries by galvanostatic non-destructive technique", Journal of Power Sources 137 (2004) pp. 128-133.
Haskins et al., "Battery Technology Life Verification Test Manual", Idaho National Laboratory, INEEL/EXT-04-01986 (Feb. 2005) 133 pages.
Hlavac et al., "VRLA Battery Monitoring Using Conductance Technology", IEEE, 12-3 (1995) pp. 284-291.
Huang et al., "An Online Battery Impedance Measurement Method Using DC-DC Power Converter Control", IEEE Transactions on Inductrial Electronics, vol. 61, No. 11 (Nov. 2014) pp. 5987-5995.
International Search Report from International Application No. PCT/US2017/020499, dated May 19, 2017, 2 pages.
International Written Opinion from International Application No. PCT/US2017/020499, dated May 19, 2017, 6 pages.
Karden et al., "A method for measurement of interpretation of impedance spectra for industrial batteries", Journal of Power Sources, 85 (2000) pp. 72-78.
Kiel et al., "Validation of single frequency Z measurement for standby battery state of health determination", IEEE, 2-3 (2008) 7 pages.
Kozlowski, James D., "A Novel Online Measurement Technique for AC Impedance of Batteries and Other dectrochemical Systems", IEEE (2001) pp. 257-262.
Motloch et al., "High-Power Battery Testing Procedures and Analytical Methodologies for HEV's", 7, SAE Int. Passenger Cars Electron. Electr. Syst., vol. 111 (2002) pp. 797-802.
Noworolski et al., "Reducing and Utilizing Electrical Noises for Battery Monitoring Purposes", IEEE 32-4 (2004) pp. 611-614.
Okoshi et al., "Battery condition monitoring (BCM) technologies about lead-acid batteries", Journal of Power Sources 158 (2006) pp. 874-878.
Pop et al., "State-of-the-art of battery state-of-charge determination", Measurement Science and Technology, 16 (2005) R93-R110.
Saha et al., "Comparison of Prognostic Algorithms for Estimating Remaining Useful Life of Batteries", Transactions of the Institute of Measurement and Control, vol. 31, Issue 3-4 (2009) 10 pages.
Singh et al., "Fuzzy logic modeling of EIS measurements on lithium-ion batteries", Electrochimica Acta, 51 (2006) pp. 1673-1679.

(56) References Cited

OTHER PUBLICATIONS

"1260 Impedance/Gain-Phase Analyzer", Operating Manual, Solartron Analytical (Jan. 1996) 215 pages.
"1287 Electrochemical Interface", User Guide, Solartron Analytical (2001) 134 pages.
Sternad et al., "Condition monitoring of Lithium-Ion Batteries for electric and hybrid electric vehicles", Elektrotechnik & Informationstechnik, 126/5 (2009) pp. 186-193.
Tachibana et al., "Development of in situ a.c. impedance measurement system under constant-current conditions and its application to galvanostatic discharge of electrolytic manganese dioxide in alkaline solution" Journal of Power Sources 74 (1998) pp. 29-33.
Tang et al., "Temperature Dependent Performance and in Situ AC Impedance of High-Temperature PEM Fuel Cells Using the Nation-112 Membrane", Journal of the Electrochemical Society, 153(11) (2006) pp. A2036-A2043.
Albrecht, Weston, "Battery Complex Impedance Identification with Random Signal Techniques," May 4, 2005, Montana Tech of the University of Montana, 99 pages.
Alpaydin, Ethem, "Radial Basis Functions," 2004, Chapter 12.3, pp. 284-290, Introduction to Machine Learning, The MIT Press, Cambridge, Massachusetts, London, England.
Bald et al., "Hardware Architecture for Rapid Impedance Measurements of 50V Battery Module", San Diego : The International Society of Automation, 2012. 58th International Instrumentation Symposium, INL/CON-12-24516, Jun. 2012, 18 pages.
"Battery Test Manual for Plug-In Hybrid Electric Vehicles", INL/EXT-07-12536, Revision 0, Mar. 2008, 67 pages.
"Battery Test Manual for Plug-In Hybrid Electric Vehicles", INL/EXT-07-12536, Revision 2, Dec. 2010, 67 pages.
Brigham, "The Fast Fourier Transform", 1974, Prentice-Hall, Chapter 1 pp. 1-10.
Brigham, "The Fast Fourier Transform", 1974, Prentice Hall, Chapter 7 pp. 110-122.
Brigham, "The Fast Fourier Transform", 1974, Prentice-Hall, Chapter 13 pp. 198-223.
Chapra, "Numerical Methods for Engineers," pp. 394-398, McGraw-Hill Publishing Company, 1985.
Christophersen, Jon P., "Battery State-Of-Health Assessment Using a Near Real-Time Impedance Measurement Technique Under No-Load and Load Conditions", A dissertation submitted in partial fulfillment of the requirements for the degree of Doctor of Philosophy in Electrical Engineering, Montana State University, Apr. 2011, 288 pages.
Christophersen et al., "Crosstalk Compensation for a Rapid, Higher-Resolution Impedance Spectrum Measurement", Aerospace Conference, 2012 IEEE, Mar. 2012, 16pages.
Christophersen et al., "Effects of Reference Performance Testing during Aging Using Commercial Lithium-ion Cells," J. Electrochem Soc., 153(7) 2006, pp. A2406-A1416.
Christophersen et al., "Electrochemical Impedance Spectroscopy Testing on the Advanced Technology Development Program Lithium-ion Cells", 2002, IEEE Trans. Veh. Technol., pp. 1851-1855, 56(3).
Christophersen et al., "Gen 2 Performance Evaluation Final Report", INL/EXT-05-00913, Advanced Technology Development Program for Lithium-Ion Batteries, Jul. 2006, 140 pages.
Christophersen, Jon P., "Impedance Noise Identification for State-of-Health Prognostics," Jul. 7-10, 2008, Philadelphia, PA, 43rd Power Sources Conference, 4 pages.
Christophersen et al., "Long-Term Validation of Rapid Impedance Spectrum Measurements as a Battery State-of-Health Assessment Technique", INL/CON-12-27063 SAE 2013 World , Apr. 2013, 11 pages.
Christophersen et al., "Lumped Parameter Modeling as a Predictive Tool for a Battery Status Monitor," Oct. 2003, Proceedings from IEEE Vehicular Technology Conference, 6 pages.
Christophersen et al., "Rapid Impedance Spectrum Measurements for State-of-Health Assessment of Energy Storage Devices", INL/CON-11-22677 SAE 2012 World Congress & Exhibition, Apr. 2012, 12 pages.

Egloff et al., "A Critical Analysis of an Instrumentation Current Sources", Cleveland : The International Society of Automation, 2013. 59th International Instrumentation Symposium, May 2013.
Fenton et al., "BSM Development Documentation Senior Project Final Report for the Idaho National Laboratory," May 2005, Montana Tech of the University of Montana, 21 pages.
"FreedomCAR Battery Test Manual for Power-Assist Hybrid Electric Vehicles," manual, Oct. 2003, Appendix D, DOE/ID-11069, Idaho National Laboratory, 130 pages.
Garcia et al., "On-line State-of-Health and Remaining-Useful-Life Assessment of Batteries using Rapid Impedance Spectrum Measurements", 45th Power Sources Conference Proceedings, 7.3, 2012, pp. 115-118.
Goebel et al., "Prognostics in Battery Health Management", IEEE Instrumentation & Measurement Magazine, 1094-6969/08, Aug. 2008, pp. 33-40.
Hoffmann et al. "Development and Test of a Real Time Battery Impedance Estimation System", IEEE Aerospace 2006 Conference, Mar. 5-11, 2006, Big Sky Montana.
Huet, F., "A review of impedance measurements for determination of the state-of-charge or state-of-health of secondary batteries", Journal of Power Sources 70, 1998, pp. 59-69.
"Impedance Measurement Box", INL R&D 100 Technologies—2011. [Online] Idaho National Laboratory. [Cited: Mar. 21, 2012.] http://www.inl.gov/rd100/2011/impedance-measurement-box/, 3 pages.
Kozlowski, James D., "Electrochemical Cell Prognostics using Online Impedance Measurements and Model-Based Data Fusion Techniques", Aerospace Conference, 2003 Proceedings, vol. 7-3257, Mar. 2003, 14 pages.
Mix, Dwight F., "Random Signal Processing," p. 296, Prentice Hall Publishing Company, 1995.
Morrison et al., "An Advanced Calibration Procedure for Complex Impedance Spectrum Measurements of Advanced Energy Storage", San Diego : The International Society of Automation, 2012. 58th International Instrumentation Symposium, INL/CON-12-24519, Jun. 2012, 17 pages.
Morrison, J. L., "DC Buffering and Floating Current for a High Voltage IMB Application", INL/EXT-14-32858, Prepared for the U.S. Department of Energy, https://inldigitallibrary.inl.gov/sti/6330933.pdf , Aug. 2014, 8 pages.
Morrison et al., "Fast Summation Transformation for Battery Impedance Identification," IEEE Aerospace 2009 Conference, Mar. 7-14, 2009, Big Sky, Montana, 9 pages.
Morrison, William H., "Intelligent Self-Evolving Prognostic Fusion, Phase I STTR Interim Report," Jul. 29, 2005, Qualtech Systems, Inc., NASA, Ames Research Center, 23 pages.
Morrison et al., "Real Time Estimation of Battery Impedance," Proceedings from the IEEE Aerospace Conference, Mar. 5-11, 2006, Big Sky, MT, 13 pages.
Morrison, J.L., "Signals and Systems: State Variable Description of Linear Time Invariant Systems", Montana Tech Digital Commons, Sep. 2013, chapter 17, pp. 198-214.
Morrison, J.L., "Signals and Systems: Recursive Solution of Linear Time Invariant Systems", Montana Tech Digital Commons, Sep. 2013, Chapter 18, pp. 215-226.
Morrison, J.L., "Signals and Systems: Synchronous Detection", Montana Tech Digital Commons, Sep. 2013, Chapter 20, pp. 241-244.
Nikolopoulos et al., "Accurate Method of Representation of High-Voltage Measuring Systems and its Application in High-Impulse-Voltage Measurements," Mar. 1989, IEEE, vol. 136, Issue 2, pp. 66-72, Science, Measurement and Technology, IEEE Proceedings A, Dept. of Electr. Eng., Nat. Tech. Univ., Athens, Greece.
PCT International Search Report and Written Opinion of the International Searching Authority for PCT/US2010/038358, dated Dec. 31, 2010, 8 pages.
PCT International Search Report and Written Opinion of the International Searching Authority for PCT/US2010/038401, dated Dec. 31, 2010, 8 pages.
PCT International Search Report and Written Opinion of the International Searching Authority for PCT/US2011/035043, dated Aug. 10, 2011, 12 pages.

(56) References Cited

OTHER PUBLICATIONS

PCT International Search Report and Written Opinion of the International Searching Authority for PCT/US11/35052, dated Jul. 26, 2011, 11 pages.

Piller et al., "Methods for state-of-charge determination and their applications", Journal of Power Sources 96, 2001, pp. 113-120.

Ramos et al., Comparison of impedance measurements in a DSP using ellipse-fit and seven-parameter sine-fit algorithms, Measurement 42 (May 23, 2009) pp. 1370-1379. Retrieved online at <http://www.sciencedirect.com/science/article/pii/S0263224109001031>.

Ranade et al., An overview of harmonics modeling and simulation, Elect. Power Syst. Res., vol. 74, pp. 37-56, Apr. 2005, Retrieved online at <http://www.calvin.edu/~pribeiro/IEEE/ieee_cd/chapters/pdffiles/c1pdf.pdf>.

Saha et al., "Prognostics Methods for Battery Health Monitoring Using a Bayesian Framework", IEEE Transactions on Instrumentation and Measurement, vol. 58, No. 2, Feb. 2009, pp. 291-296.

Smith et al., "Model Validation Approaches for Nonlinear Feedback Systems Using Frequency Response Measurements," Dec. 7-10, 1999, 1500-1504, vol. 2, IEEE, Proceedings of the 38th IEEE Conference on Decision and Control, Phoenix, AZ.

Smyth, Brian, "Development of a Real Time Battery Impedance Measuring System," M.S. Thesis Montana Tech of the University of Montana, 2008, 128 pages.

U.S. Appl. No. 61/831,001 to Christophersen et al., titled "Apparatuses and Methods for Testing Electrochemical Cells by Measuring Frequency Response", filed Jun. 4, 2013.

Wasserman, Philip D., "Radial Basis-Function Networks," Chapter 8, pp. 147-176, Advanced Methods in Neural Computing, 1993, New York: Van Nostrand Reinhold.

Ziemer et al., "Signals and Linear Systems," 2002, Chapter 2, pp. 56-123, Principles of Communications, 5th edition, John Wiley & Sons.

Belt et al., "Calendar and PHEV cycle life aging of high-energy, lithium-ion cells containing blended spinel and layered-oxide cathodes", Journal of Power Sources 196, 2011, pp. 10213-10221.

Zou et al., "Combined State of Charge and State of Health estimation over lithium-ion battery cell cycle lifespan for electric vehicles", Journal of Power Sources 273 (2015) pp. 793-803.

Zhang et al., "Prediction of Lithium-Ion Baller! s Remaining Useful Life Based on Relevance Vector Machine", SAE Int. J. All. Power 5(1) (May 2016) pp. 30-40.

Xing et al., "Prognostics and Health Monitoring for Lithium-ion Battery", Proceedings of the IEEE International Conference on Intelligence and Security Informatics, (2011) pp. 242-247.

Xing et al., "Battery Management Systems in Electric and Hybrid Vehicles", Energies 2011, 4, pp. 1840-1857.

Wu et al., "A Review on Fault Mechanisms and Diagnosis Approach for Li-Ion Batteries", Journal of Nanomaterials, Article ID 631263 (2015) 10 pages.

Weng et al., "On-board state of health monitoring of lithium-ion batteries using incremental capacity analysis with support vector regression", Journal of Power Sources 235 (2013) pp. 36-44.

Taberna et al., "Electrochemical Characteristics and Impedance Spectroscopy Studies of Carbon-Carbon Supercapacitors", Journal of the Electrochemical Society, 150(3), (2003) pp. A292-A300.

Stroe et al., "Diagnosis of Lithium-Ion Batteries State-of-Health based on Electrochemical Impedance Spectroscopy Technique", Proceedings of the 2014 Energy Conversion Congress and Exposition (ECCE) IEEE Press, pp. 1576-4582.

Srivastav et al., "State-of-charge indication in Li-ion batteries by simulated impedance spectroscopy", J Appl Electrochem 47 (2017) pp. 22-236.

Socher et al., "Improving the functional safety of automotive batteries using in-situ impedance spectroscopy", Transportation Research Procedia 14 ( 2016) pp. 3661-3666.

Schweiger et al., "Comparison of Several Methods for Determining the Internal Resistance of Lithium Ion Cells", Sensors, 10, (2010) pp. 5604-5625.

Sazhin et al., "Enhancing Li-Ion Battery Safety by Early Detection of Nascent Internal Shorts", Journal of the Electrochemical Society, 164 (1), (2017) pp. A6281-A6287.

Salehen et al., "Development of battery management systems (BMS) for electric vehicles (EVs) in Malaysia", MATEC Web of Conferences, 90, 01001 (2017), AiGEV 2016, 8 pages.

Raijmakers et al., "Crosstalk Interferences on Impedance Measurements in Battery Packs", IFAC-PapersOnline 49(11) (2016) pp. 042-047.

Rahmoun et al., "Determination of the Impedance of Lithium-Ion Batteries using Methods of Digital Signal Processing", Energy Procedia 46 (2014) pp. 204 213.

Qnovo "Fundamentals of Qnovo Adaptive Charging in Lithium Ion Batteries" http://qnovo.com/wp-content/uploads/2015/12/Qnovo.sub.--TechWhitePaper.su- b.-v2.4.pdf, (2015) 13 pages.

Pastor-Fernandez et al., "A Study of Cell-to-Cell Interactions and Degradation in Parallel Strings: Implications for the Battery Management System", Journal of Power Sources 329 (2016) pp. 574-585.

Pastor-Fernandez et al., "A Comparison between EIS and IC-DV as Li-ion Diagnostic Techniques to Identify and Duantify the Effects of Degradation Modes within BMS", Journal of Power Sources 360 (2017) pp. 301-318.

Morrison, "CSD Algorithms As Matlab Code for Real Time Estimation of Battery Impedance", Montana Tech of the University of Montana (Sep. 2005), 20 pages.

Mingant et al., "Towards onboard Li-ion battery state-0f-health diagnosis by a virtual sensor", World Electric Vehicle Journal, vol. 5 (2012) pp. 405-411, EVS26.

Lu et al., "A review on the key issues for lithium-ion battery management in electric vehicles", Journal of Power Sources 226 (2013) pp. 272-288.

Li et al., "Understanding the molecular mechanism of pulse current charging for stable lithium-metal batteries", Sci. Adv. 3, e1701246 (2017) 10 pages.

Le et al., "Lithium-ion Battery State of Health Estimation Using Ah-V Characterization", Annual Conference of the Prognostics and Health Management Society, (2011) 7 pages.

Howey et al., "On-line measurement of battery impedance using motor controller excitation", IEEE Transactions on Vehicular Technology, vol. 63, Issue 6, (Jul. 2014) pp. 2557-2566.

Guha et al., "Remaining Useful Life Estimation of Lithium-Ion Batteries based on the Internal Resistance Growth Model" Indian Control Conference (ICC), (2017) pp. 33-38.

Farmann et al., "Critical review of on-board capacity estimation techniques for lithium-ion batteries in electric and hybrid electric vehicles", Journal of Power Sources 281 (2015) pp. 114-130.

Cheng et al., "Battery-Management System (BMS) and SOC Development for Electrical Vehicles", IEEE Transactions on Vehicular Technology, vol. 60, No. 1, (Jan. 2011) pp. 76-88.

Cabrera-Castillo et al, "Calculation of the state of safety (SOS) for lithium ion batteries", Journal of Power Sources 324 (2016) pp. 509-520.

Brigham, "The Fast Fourier Transform", 1974, Prentice-Hall, Chapter 6 pp. 91-109.

Brauer et al., "Residential Energy Storage from Repurposed Electric Vehicle Batteries: Market Overview and Development of a Service-Centered Business Model", IEEE 18th Conference on Business Informatics, (2016) pp. 143-152.

Barsukov et al., "Challenges and Solutions in Battery Fuel Gauging", www.ti.com/lit/ml/slyp086/slyp086.pdf, Power Management Workbook. Texas Instruments Inc., (2004), 10 pages.

Adany et al., "Switching algorithms for extending battery life in Electric Vehicles", Journal of Power Sources, 231 (2013) pp. 50-59.

Thomas et al., "Statistical methodology for predicting the life of lithium-ion cells via accelerated degradation testing", Journal of Power Sources, 184 (2008) pp. 312-317.

Unkelhaeuser et al., "Electrochemical Storage System Abuse Test Procedure Manual", United States Advanced Battery Consortium, SAND99-0497 (Jul. 1999) 28 pages.

Verbrugge, Mark, "Adaptive, multi-parameter battery state estimator with optimized time-weighting factors" J Appl Electrochem, vol. 37 (2007) pp. 605-616.

(56) References Cited

OTHER PUBLICATIONS

Verbrugge et al., "Adaptive state of charge algorithm for nickel metal hydride batteries including hysteresis phenomena" Journal of Power Sources, 126 (2004) pp. 236-249.
Waligo et al., "A Comparison of the Different Broadband Impedance Measurement Techniques for Lithium-Ion Batteries", Energy Conversion congress and Exposition (ECCE), IEEE (2016) 7 pages.
Yamada et al., "The intelligent automotive battery, 'CYBOX'", Journal of Power Sources 185 (2008) pp. 1478-1483.
Yoo et al., "An Electrochemical Impedance Measurement Technique Employing Fourier Transform", Analytical Chemistry, vol. 72, No. 9 (May 2000) pp. 2035-2041.
Zechang et al., "Battery Management Systems in the China-made 'Start' series FCHVs", IEEE Vehicle Power and Propulsion Conference (VPPC) (Sep. 2008) 6 pages.
Zhang et al., "Cycling degradation of an automotive LiFePO4 lithium-ion battery", Journal of Power Sources, 196 (2011) pp. 1513-1520.
Zhu et al., "In-Situ Assessment of PEM Fuel Cells via AC Impedance at Operational Loads", http://folk.ntnu.no/skoge/prost/proceedings/aiche-2004/pdffiles/papers/014g.pdf (2004) 5 pages.
Zhu et al., "In-Situ Electrical Characterization of PEM Fuel Cells at Load", American Institute of Chemical Engineers (2007) 5 pages.
Zhu et al., "PSpice Simulation via AC Impedance for PEFC at Operational Loads", http://folk.ntnu.no/skoge/prost/proceedings/aiche-2005/topical/pdffiles/T1/papers/215c.pdf (2005) 3 pages.
Xueyuan et al., "State Estimation of Lithium ion Battery Based on Electrochemical Impedance Spectroscopy with On-board Impedance Measurement System," IEEE Vehicle Power and Propulsion Conference, 2015, 5 pages.
Varnosfaderani et al., "Online Impedance Spectroscopy Estimation of a dc-dc converter connected Battery using an Earth Leakage Monitoring Circuit," 19th European Conference on Power Electronics and Applications, 2017, pp. P.1-P.10.
Varnosfaderani et al., "Online Impedance Spectroscopy Estimation of a Battery," 18th European Conference on Power Electronics and Applications, 2017, 10 pages.
Varnosfaderani et al., "A Comparison of Online Electrochemical Spectroscopy Impedance Estimation of Batteries," IEEE Access, vol. 6, 2018, pp. 23668-23677.
Ranieri et al., "Electronic Module for the Thermal Monitoring of a Li-ion Battery Cell through the Electrochemical Impedance Estimation," 22nd International Workshop on Thermal Investigations of ICs and Systems, Sep. 21-23, 2016, pp. 294-297.
Ran et al, "Prediction of State of Charge of Lithium-ion Rechargeable Battery with Electrochemical Impedance Spectroscopy Theory," 5th IEEE Conference on Industrial Electronics and Applications, 2010, pp. 684-688.
Qahouq et al., "Single-Perturbation-Cycle Online Battery Impedance Spectrum Measurement Method With Closed-Loop Control of Power Converter," IEEE Transactions on Industrial Electronics, vol. 64, No. 9, September 2017, pp. 7019-7029.
Piret et al., "Tracking of electrochemical impedance of batteries," Journal of Power Sources, vol. 312, 2016, pp. 60-69.
Koch et al., "On-line Electrochemical Impedance Spectroscopy Implementation for Telecommunication Power Supplies," IEEE International Telecommunications Energy Conference, 2015, 6 pages.
Koch et al., "Impedance Spectroscopy for Battery Monitoring with Switched Mode Amplifiers," 16th International Power Electronics and Motion Control Conference and Exposition, Antalya, Turkey Sep. 21-24, 2014, pp. 496-501.
Koch et al., "Electrochemical Impedance Spectroscopy for Online Battery Monitoring—Power Electronics Control," 16th European Conference on Power Electronics and Applications, 2014, 10 pages.
Katayama et al., "Real-Time Electrochemical Impedance Diagnosis for Fuel Cells Using a Dc—Dc Converter," IEEE Transactions on Energy Conversion, vol. 30, No. 2, Jun. 2015, pp. 707-713.
Karden et al, "A method for measurement and interpretation of impedance spectra for industrial batteries", Journal of Power Sources, vol. 85, 2000, pp. 72-78.
Jaber A. Abu Qahouq, "Online Battery Impedance Spectrum Measurement Method," IEEE Applied Power Electronics Conference and Exposition, 2016, pp. 3611-3615.
Harting et al., "State-of-Health Diagnosis of Lithium-Ion Batteries Using Nonlinear Frequency Response Analysis," Journal of the Electrochemical Society, vol. 166, No. 2, 2019, pp. A277-A285.
Doan et al, "Intelligent Charger with Online Battery Diagnosis Function," 9th International Conference on Power Electronics-ECCE Asia, Jun. 1-5, 2015, pp. 1644-1649.
Din et al., "Online Spectroscopic Diagnostics Implemented in an Efficient Battery Management System," 16th Workshop on Control and Modeling for Power Electronics, 2015, 7 pages.
Din et al., "A Scalable Active Battery Management System With Embedded Real-Time Electrochemical Impedance Spectroscopy," IEEE Transactions on Power Electronics, vol. 32, No. 7, Jul. 2017, pp. 5688-5698.
Cho et al, "Battery Impedance Analysis Considering DC Component in Sinusoidal Ripple-Current Charging," IEEE Transactions on Industrial Electronics, vol. 63, No. 3, Mar. 2016, pp. 1561-1573.
Chen et al., "Sinusoidal-Ripple-Current Charging Strategy and Optimal Charging Frequency Study for Li-Ion Batteries", IEEE Transactions on Industrial Electronics, vol. 60, No. 1, Jan. 2013, pp. 88-97.
Breugelmans et al., "Odd random phase multisine electrochemical impedance spectroscopy to quantify a non-stationary behaviour: Theory and validation by calculating an instantaneous impedance value," Electrochimica Acta, vol. 76, 2012, pp. 375-382.
Brett Novak, "Developing an advanced, predictive battery health monitoring solution with a low-cost microcontroller solution," Texas Instruments, White Paper, Sep. 2012, 6 pages.

* cited by examiner

DEVICE, SYSTEM, AND METHOD FOR MEASURING INTERNAL IMPEDANCE OF A TEST BATTERY USING FREQUENCY RESPONSE

STATEMENT REGARDING FEDERALLY SPONSORED RESEARCH OR DEVELOPMENT

The invention was made with government support under Contract No. DE-AC07-05-ID14517, awarded by the United States Department of Energy. The government has certain rights in this invention.

CROSS-REFERENCE TO RELATED APPLICATIONS

This application is related to U.S. patent application Ser. No. 14/296,321, filed Jun. 4, 2014, published as US 2014/0358462, pending, which claims benefit of U.S. Provisional Application 61/831,001, filed on Jun. 4, 2013. This application is also related to U.S. patent application Ser. No. 14/789,959, filed Jul. 1, 2015, now U.S. Pat. No. 9,851,414, issued Dec. 26, 2017. The disclosure of each of the foregoing applications is hereby incorporated in their entirety by this reference.

FIELD

Embodiments of the present disclosure relate to apparatuses, systems, and methods for impedance measurement of energy storage cells, such as electrochemical cells, and more particularly, to analysis of the state of health of energy storage cells.

BACKGROUND

Chemical changes to electrodes in a rechargeable battery may cause degradation in the battery's capacity, duration of charge retention, charging time, and other functional parameters. Battery degradation may accumulate over the life of the battery. Environmental factors (e.g., high temperature) and functional factors (e.g., improper charging and discharging) may accelerate battery degradation. Operators of systems that rely on rechargeable battery power may desire to monitor the degradation of the batteries they use. One indicator of battery degradation is an increase in battery impedance.

FIG. 1 is an impedance plot 102 of a fresh battery and an impedance plot 104 of an aged battery, measured at several different frequencies using an Electrochemical Impedance Measurement (EIM) system. The Y-axis is the imaginary impedance and the X-axis is the real impedance for a plurality of different frequencies plotted in FIG. 1. As illustrated in FIG. 1, the aged battery (plot 104) exhibits a higher impedance than the fresh battery (plot 102) at each of the different frequencies. Operators of systems that rely on rechargeable batteries may use impedance data, such as the impedance data of FIG. 1, to determine that a replacement battery is needed before a failure occurs. Such preemptive replacement may prevent expensive delays and property damage that may occur in the event of a battery failure. Also, knowledge of a battery's continued reliability may prevent expenses associated with unnecessarily replacing a battery that still has a substantial amount of lifetime left.

Existing impedance measurement systems have a resolution of approximately 0.1 mOhm when operating at an excitation current range of approximately 500 mA. As a result, existing impedance measurement systems may be able to determine the impedance of a test battery exhibiting a 10 mOhm internal impedance with adequate resolution. The resolution of existing impedance measurement systems may limit the ability to test batteries exhibiting lower internal impedance (e.g., 1 mOhm). Other methods of impedance measurement (e.g., electrochemical impedance spectroscopy) may achieve high resolution, but may be slow to be tuned, such as requiring time on the order of about 10 minutes to obtain the measurements.

BRIEF SUMMARY

Disclosed herein is an impedance measurement device. The impedance measurement device comprises a current driver configured to generate an excitation current signal to be applied to a test battery responsive to a control signal, and a processor operably coupled with the current driver. The processor is configured to generate the control signal during an auto-ranging mode and a measuring mode. The auto-ranging mode applies the excitation current signal to the test battery over a plurality of different amplitudes to measure a response to the excitation current signal at each amplitude. The measuring mode applies the excitation current signal to the test battery for an amplitude responsive to the results of the auto-ranging mode.

In some embodiments, an impedance measurement system is disclosed. The impedance measurement system includes a test battery and an impedance measurement device operably coupled to the test battery. The impedance measurement device includes a preamplifier including a current driver and a signal measuring module operably coupled with the test battery, a current control signal generator operably coupled with the preamplifier, a data acquisition system operably coupled with the preamplifier, and a processor operably coupled with the current control signal generator and the data acquisition system. The processor is configured to control the current control signal generator to transmit a current control signal to the preamplifier during an auto-ranging mode to cause the current driver to generate an excitation current signal exhibiting a range of amplitudes, control the data acquisition system to analyze the response of the test battery from the signal measuring module during the auto-ranging mode, control the current control signal generator to transmit the current control signal to the preamplifier during a measuring to cause the current driver to generate the excitation current signal exhibiting an selected amplitude based, at least in part, on analyzing the response of the test battery during the auto-ranging mode, and control the data acquisition system to analyze the response of the test battery from the signal measuring module during the measuring mode to determine an impedance of the test battery.

In some embodiments, a method of measuring impedance of a test battery is disclosed. The method comprises applying an excitation current signal to a test battery including a plurality of pulses exhibiting different amplitudes during an auto-ranging mode, measuring an electrical signal from the test battery responsive to the excitation current signal over the plurality of different amplitudes, applying the excitation current signal to the test battery exhibiting a fixed amplitude during a measuring mode, wherein the fixed amplitude is set based, at least in part, on an analysis of the electrical signal measured during the auto-ranging mode, and measuring the electrical signal from the test battery responsive to the excitation current signal exhibiting the fixed amplitude during the measuring mode to determine an internal impedance of the test battery.

DETAILED DESCRIPTION

Figure 1:
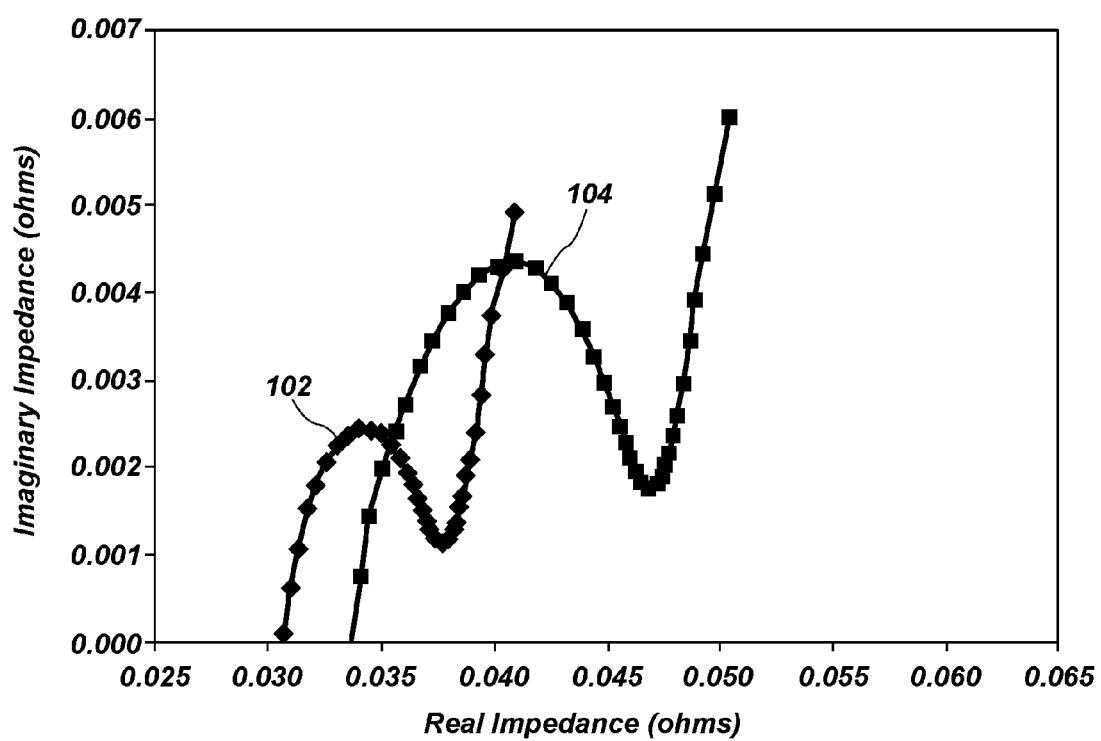
FIG. 1 is an impedance plot of a fresh battery and an impedance plot of an aged battery, measured at several different frequencies using an Electrochemical Impedance Measurement System.

In the following detailed description, reference is made to the accompanying drawings, which form a part hereof, and in which is shown by way of illustration specific embodiments in which the present disclosure may be practiced. These embodiments are described in sufficient detail to enable those of ordinary skill in the art to practice the present disclosure. It should be understood, however, that the detailed description and the specific examples, while indicating examples of embodiments of the present disclosure, are given by way of illustration only and not by way of limitation. From this disclosure, various substitutions, modifications, additions rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely idealized representations that are employed to describe various embodiments of the present disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

The various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be rearranged. A process may correspond to a method, a function, a procedure, a subroutine, a subprogram, etc. Furthermore, the methods disclosed herein may be implemented in hardware, software, or both. If implemented in software, the functions may be stored or transmitted as one or more computer-readable instructions (e.g., software code) on a computer-readable medium. Computer-readable media may include both computer storage media and communication media including any medium that facilitates transfer of a computer program from one place to another. Computer-readable media may include volatile and non-volatile memory, such as, for example, magnetic and optical storage devices, such as, for example, hard drives, disk drives, magnetic tapes, CDs (compact discs), DVDs (digital versatile discs or digital video discs), solid state storage devices (solid state drives), and other similar storage devices.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. When describing circuit elements, such as, for example, resistors, capacitors, and transistors, designators for the circuit elements begin with an element type designator (e.g., R, C, M) followed by a numeric indicator.

As used herein, the terms "energy storage cell" and "energy storage cells" refer to rechargeable electrochemical cells that convert chemical energy to a direct current electrical voltage potential across a positive terminal and a negative terminal of the energy storage cell. The terms "battery," "cell," and "battery cell" may each be used interchangeably herein with the term "energy storage cell."

As used herein, the term "mid-range voltage" means a voltage in a range near 50 V. Thus, a mid-range voltage may include an average voltage of about 40 V to 60 V with a variation of about 90% to 99% depending on the tolerances desired for a given system.

As used herein, the term "high-range voltage" means a voltage in a range near 300 V. Thus, a high-range voltage may include an average voltage of about 250 V to 350 V with a variation of about 90% to 99% depending on the tolerances desired for a given system.

As used herein, the terms "sinusoid," and "sinusoidal," refer to electrical signals (e.g., currents and voltage potentials) that oscillate at least substantially according to a sine or cosine function (e.g., having various magnitudes and phase shifts) over time. As should be readily apparent to those of ordinary skill in the art, any given sinusoidal signal may be equivalently expressed either as a sine function or a cosine function, as the sine and cosine are merely phase-shifted versions of each other. Sinusoidal signals are disclosed herein as being applied to energy storage cells and shunts (e.g., resistors of known resistance values for calibration purposes). In some cases, these sinusoidal signals are referred to more specifically herein as either sine signals or cosine signals. These specific references to sine signals and cosine signals may be indicative of the phase of such signals relative to a time when a sinusoidal signal is first asserted to a conductive line (e.g., a positive or negative battery terminal, a conductive trace on a circuit board, a wire, etc.).

As used herein, the term "sum-of-sinusoids" ("SOS") refers to electrical signals that oscillate according to a sum of sinusoidal signals. An SOS signal may include sums of sine signals, sums of cosine signals, or combinations thereof. For example, a harmonic orthogonal synchronous transform (HOST) SOS signal may include a base sinusoidal signal having a base frequency summed with one or more sinusoidal signals having successive integer harmonic frequencies of the base frequency, and alternating between sine signals and cosine signals (or some phase-shifted version thereof) for each successive harmonic. The orthogonal nature of the harmonic sinusoidal signals summed together in a HOST SOS may serve to reduce or eliminate excessive transients. While examples are provided herein referring to SOS signals, embodiments of the present disclosure also contemplate using other types of excitation signals, including sum of alternating sines, cosines (ASC) signals.

Figure 2:
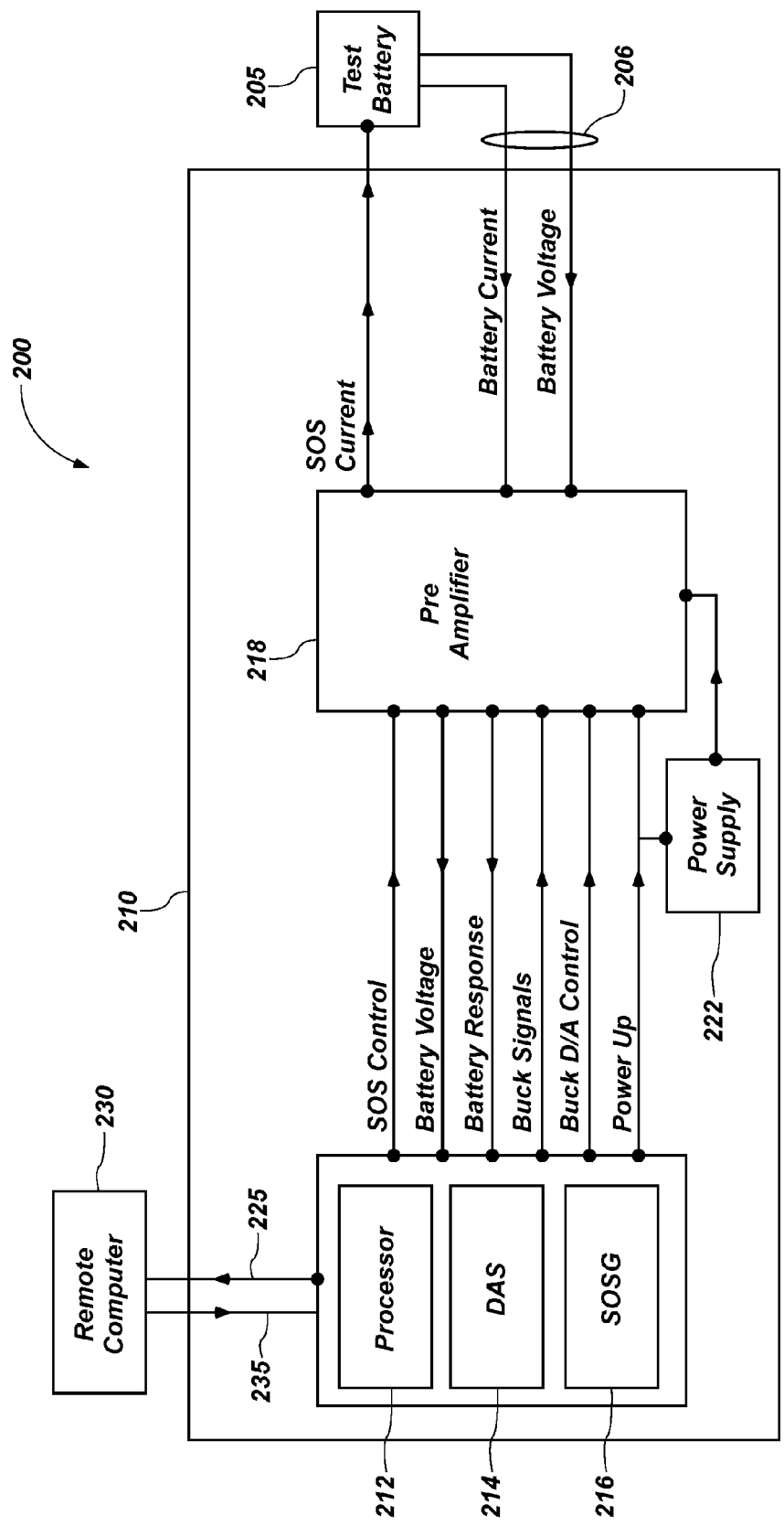
FIG. 2 is a simplified block diagram of an impedance measurement system configured to perform real-time impedance spectrum measurement of a test battery according to an embodiment of the present disclosure.

FIG. 2 is a simplified block diagram of an impedance measurement system 200 configured to perform real-time impedance spectrum measurement of a test battery 205 according to an embodiment of the present disclosure. The test battery 205 refers to the battery under test, and may be an actual battery deployed and in use by an end user. The impedance measurement system 200 may include an impedance measurement device (IMD) 210 (sometimes referred to as an impedance measurement box (IMB)) operably coupled to the test battery 205. The IMD 210 may include a processor 212, a data acquisition system (DAS) 214, an SOS generator (SOSG) 216, a preamplifier 218, and a power supply 222. The IMD 210 may be used in a variety of different environments and battery types such that the health of the battery may be monitored in situ. As an example, the impedance measurement system 200 may be incorporated within an automobile or other vehicle with batteries that include one or more energy storage cells. Such vehicles may include electric or hybrid vehicles. It is also contemplated that embodiments of the disclosure may be employed in non-vehicular applications such as, by way of non-limiting example, in association with energy storage cells operably coupled to solar, wind, or tidal energy generation systems.

The SOSG 216 may be configured to generate an SOS control signal to the preamplifier 218 to control an SOS current signal output by the preamplifier 218. The SOS control signal may be selected to cause the preamplifier 218 to provide an SOS current signal including a sum of a plurality of different current signals having a plurality of different frequencies of interest for testing impedance of the test battery 205. In some embodiments, the SOS control signal may include a voltage signal proportional to a desired current for the SOS current signal to be output by the preamplifier 218. Accordingly, the SOS control signal may include an SOS voltage signal. An SOS signal is used herein as an example, and the SOSG 216 may be an excitation current control signal generator that is configured to control other types of excitation current signals to apply to the test battery 205. Thus, SOS signals are used herein as a non-limiting example of a signal that may be applied to the test battery 205.

The IMD 210 may be configured to measure electrical signals 206 at terminals of the test battery 205 responsive to the SOS current signal being applied to the terminals of the test battery 205. The preamplifier 218 may be configured to measure a battery response signal (e.g., voltage response and/or current response) responsive to receiving the electrical signals 206 from the test battery 205. The DAS 214 may be configured to receive the battery response signal and compute the impedance of the test battery 205 at the frequencies of the SOS control signal. In this way, the IMD 210 may be configured to test the impedance of the test battery 205 at a plurality of different frequencies substantially simultaneously.

Figure 3:
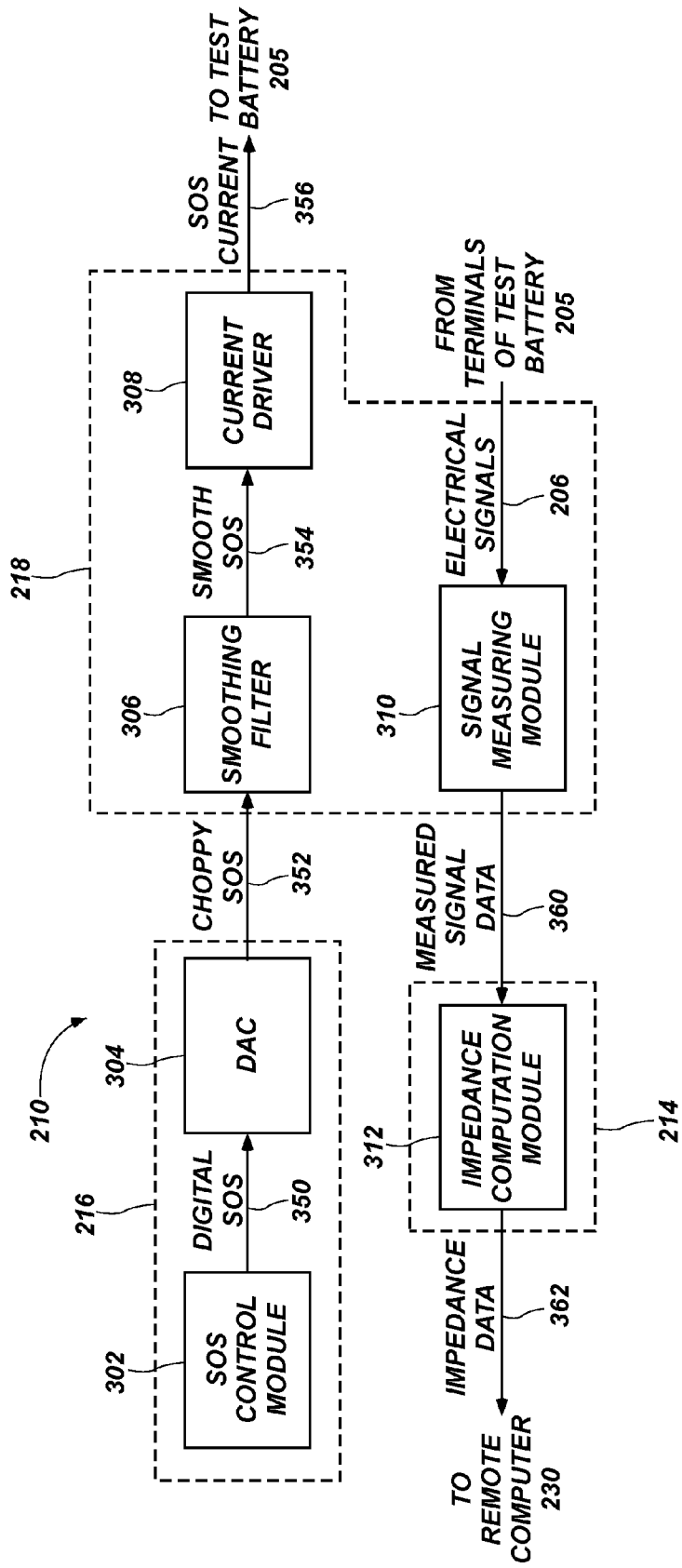
FIG. 3 is a simplified block diagram of selected features of the impedance measurement device of the impedance measurement system of FIG. 2.

In some embodiments, the DAS 214 may divide the measured voltage response by the measured current response to obtain the impedance response of the test battery 205. In such embodiments, no calibration may be needed because the impedance of the test battery 205 may be determined by dividing a measured voltage by a measured current. In some embodiments, the DAS 214 may be configured to measure only a voltage response of the test battery 205 to the SOS current signal 356 (FIG. 3). In such embodiments, calibration may be needed to determine the impedance of the test battery 205. Different calibration methods (e.g., single-shunt calibration, multiple shunt calibration, etc.) are contemplated, which may be used to account for real and imaginary portions of signals. For a single shunt method, a standard deviation may be determined for its measurements over time, and then an unknown shunt resistance may be determined by equating a ratio of the known single shunt resistance to the standard deviation of the measurements over its time record.

The IMD 210 may utilize data processing methods (e.g., algorithms) for generating battery impedance spectrum data 225. Impedance spectrum data 225 may be transmitted from the IMD 210 to a remote computer 230. The impedance spectrum data 225 may be formatted in any suitable format (e.g., Comma Separated Values (CSV) format). Each individual spectrum may include a time stamp, an information header, and the impedance spectrum data 225 may include the frequencies, the real part of the impedance, the imaginary part of the impedance and the common mode battery voltage for that spectrum. Additional data that may be transmitted to the remote computer 230 with the impedance spectrum data 225 include the SOS RMS current and the magnitude and phase calibration constants. The remote computer 230 may include a personal computer, a tablet computer, a laptop computer, a smart phone, a server, a vehicle computer (e.g., central processing unit), or other suitable computing devices.

A user may control the IMD 210 from the remote computer 230 using commands 235 via an interface, such as a Universal Serial Bus (USB) interface, hardwire serial interfaces, hardwire parallel interfaces, a wireless interfaces (e.g., WiFi, ZIGBEE®, BLUETOOTH®), or other suitable interface. For example, the IMD 210 may be able to be controlled via a human interface on the remote computer 230 or the IMD 210 for the purpose of inputting control constraints to the IMD 210, performing embedded system diagnostics, calibration, or performing manual impedance spectrum acquisition. The IMD 210 may implement a minimum of three-point magnitude and phase calibration for each frequency within the SOS control signal.

The processor 212 may be configured to synchronize and control the DAS 214, the SOSG 216, and the preamplifier 218. In some embodiments, the measurements may be performed according to a set schedule and/or control parameters dictated by the remote computer 230. As a non-limiting example, the processor 212 may interface with the remote computer 230 to download desired parameters and commands and upload various measured data. As non-limiting examples, the processor 212, or other devices not shown such as memory, may include adequate buffer memory to hold an acquired battery response time record until processed, hold the desired number of battery impedance spectrums for archive, hold system control and interface software, hold high resolution SOS samples, and hold the impedance spectrum control parameters. The processor 212 may be further configured to accept downloaded impedance spectrum control and calibration parameters and upload to the remote computer 230 archived battery impedance spectrum data under direction of the remote computer 230.

In operation, when a measurement is executed, the DAS 214 may transmit a digital signal ("Power Up") to the power supply 222 to cause the power supply 222 to power up the rest of the system (e.g., the preamplifier 218). The electrical signals 206 may be measured by the in the preamplifier 218 and input to the DAS 214 as the analog signal "Battery Voltage." At least one of the DAS 214 or the processor 212 may digitize the voltage and may send the digitized result to the remote computer 230. At least one of the remote computer 230 or the processor 212 may then process the measured DC battery voltage and use the DAS 214 to send a series of digital signals (e.g., "Buck Signals", "Buck D/A Control," etc.) to the preamplifier 218 to generate a DC bias voltage to subtract from the DC voltage response from the overall response of the test battery 205. As will be discussed further below with reference to FIG. 5, a low buck signal and a high buck signal may be generated to achieve the higher gain signals used for improved measurement resolution.

With the preamplifier 218 connected to the test battery 205, at least one of the remote computer 230 or processor 212 sends a measurement signal such as, for example, the SOS control signal or other suitable measurement signal to the preamplifier 218. When the test battery 205 is excited with the SOS current, the voltage that appears at its terminals may be the battery voltage plus any voltage drop of the SOS current acting on the internal impedance of the test battery 205. It is this SOS voltage drop that, when captured and processed, will yield the spectrum of the battery impedance for the test battery 205. A challenge may be that the battery voltage can be as much as two orders of magnitude greater than the SOS voltage drop. Thus, to accurately detect that signal, the battery voltage may be subtracted out prior to measuring the SOS voltage drop allowing all the bits of resolution of the A/D convertor to focus on the desired signal to greatly improve accuracy. This subtraction of the battery voltage may be accomplished by measuring the battery voltage prior to the application of the SOS current and then feeding back a computer generated buck voltage that is subtracted with a differential amplifier from the total battery voltage to yield only the SOS voltage.

In one embodiment, the SOSG 216, under control of the processor 212, may be configured to synthesize a sample clock to be used by the DAS 214. The sample clock frequency may be selected at a rate that may differ depending on the data processing method used. The SOSG 216 may have a programmable signal level for the DAC output to the smoothing filter 306 (FIG. 3), which enables the processor 212 to control the SOS RMS current level to the test battery 205. The SOSG 216, under the control of the processor 212, may be configured to operate in an auto-ranging mode as well as a measuring mode. The auto-ranging mode may occur prior to the measuring mode to determine the SOS current amplitude that should be used for the SOS current during the measuring mode. The auto-ranging mode and the measuring mode will be discussed further below with respect to FIG. 6.

The DAS 214 may be configured with a desired resolution (e.g., 16 bit, 32 bit, etc.) and accept an external sample clock from the SOSG 216 with clock frequency that may range, for example, from 1 kHz to 100 kHz. The DAS 214 may accept an enable signal from the processor 212 to start acquiring data concurrent with the application of the SOS current signal to the test battery 205 being tested during its auto-ranging mode or its measuring mode. The DAS 214 may accept the analog battery voltage signal that has been conditioned by the preamplifier 218 for digitizing. The DAS 214 may include a buffer memory to hold a sample of the digitized battery voltage signal for uploading to memory (not shown). Each of the acquired samples may become part of the time record array that is input into the data processing method. Additionally, the DAS 214 may acquire a measurement of the DC voltage and case temperature of the test battery 205 prior to the application of the SOS current.

In some embodiments, the SOS current leads may be configured as a twisted pair and protected with a fuse. The preamplifier 218 may utilize a full differential battery voltage sense and may incorporate a method to bias out the common mode battery voltage from the batteries response to the SOS current excitation. This biasing may enable the full resolution of the DAS 214 to be focused upon the test batteries response to the SOS current rather than the average battery voltage.

The preamplifier 218 input signal may be the zero order hold SOS control signal from the SOSG 216. The preamplifier 218 may include an active Butterworth low-pass filter as the smoothing filter 306 (FIG. 3) and include about 1 dB of attenuation at 8 kHz and 60 dB of attenuation to the frequencies introduced by the zero order hold upon the SOS signal. The SOS control signal may then be fed into a current driver 308 (FIG. 3), which converts the SOS control signal into a current (e.g., "SOS Current") provided to the test battery 205. A signal measuring module 310 (FIG. 3) of the preamplifier 218 may detect the battery voltage and subtract a DC buck voltage to become the battery response that may be digitized by the DAS 214. The resultant battery response may be used by various data processing methods discussed herein to generate the impedance spectrum.

In some embodiments, an optional connection circuit (not shown) may be included between the preamplifier 218 and the test battery 205 to isolate at least one signal line of the preamplifier 218 providing the SOS current signal from a direct current voltage sourced by the test battery 205. As a result, sensitive electronics included in the preamplifier 218 may not be exposed to the extremes of the direct current voltage potential sourced by the test battery 205. Also, the preamplifier 218 may be subjected to less noise than if the analog ground were extended outside of the preamplifier 218. As a result, the connection to the test battery 205 may be disconnected when the SOS current signal is not being sent to the test battery 205. An example of such an optional connection circuit that uses relays coupled to between the preamplifier 218 and the test battery 205 is described in United States Patent Application Publication No. 2014/0358462, filed Jun. 4, 2014, entitled "Apparatuses and Methods for Testing Electrochemical Cells by Measuring Frequency Response." As described previously, the disclosure of this application is incorporated in its entirety by the reference above.

FIG. 3 is a simplified block diagram of selected features of the IMB 210 of the impedance measurement system 200 of FIG. 2. As shown in FIG. 3, the IMD 210 may include an SOS control module 302, a digital-to-analog converter (DAC) 304, a smoothing filter 306, a signal measuring module 310, and an impedance computation module 312. The SOSG 216 may incorporate the SOS control module 302 and the DAC 304. The preamplifier 218 may incorporate the smoothing filter 306, the current driver 308, and the signal measuring module 310. The DAS 214 may incorporate the impedance computation module 312.

The SOS control module 302 may be configured to generate a digital SOS signal 350 including a sum of sinusoids having a plurality of different frequencies that are of interest for impedance measurement of the test battery 205 (FIG. 2). The digital SOS signal 350 may be sampled at least at a Nyquist rate of a highest one of the plurality of different frequencies of the digital SOS signal 350. The digital SOS signal 350 may also represent at least one period of a lowest one of the plurality of different frequencies of the digital SOS signal 350. The SOS control module 302 may be configured to provide the digital SOS signal 350 to the DAC 304.

The DAC 304 may be configured to convert the digital SOS signal 350 to an analog signal transmitted to the preamplifier 218. As those of ordinary skill in the art should understand, digital signals, such as the digital SOS signal 350, are only capable of manifesting a discrete set of discontinuous signal levels. As a result, when digital signals are converted to analog signals, the analog equivalent may manifest stepwise, or "choppy," fluctuations. Thus, the analog signal generated by the DAC 304 may be a choppy SOS signal 352 that manifests stepwise fluctuations. This choppy SOS signal 352 may be received by the smoothing filter 306 within the preamplifier 218. In some embodiments, the smoothing filter 306 may be incorporated within the SOSG 216.

The smoothing filter 306 may be configured to "smooth" the choppy SOS signal 352 to provide a smooth SOS control signal 354. By way of non-limiting example, the smoothing filter 306 may include a low-pass filter configured to smooth the stepwise fluctuations of the choppy SOS signal 352. The smooth SOS control signal 354 may be provided to the current driver 308. Responsive to the smooth SOS control signal 354 being provided to the current driver 308, the current driver 308 may transmit a corresponding SOS current signal (FIG. 2) to the test battery 205.

As should be appreciated by those of ordinary skill in the art, a filter may alter a magnitude, phase, or combination thereof, of periodic signals. It should also be appreciated that filters may alter the magnitude and phase of different components of signals oscillating at different frequencies in different ways. Accordingly, each of the different frequency components of the smooth SOS control signal 354 may be altered in magnitude, frequency, or a combination thereof, from the corresponding magnitude and frequency of the different frequency components of the digital SOS signal 350, due at least in part to the smoothing filter 306.

In some embodiments, properties of the smoothing filter 306 may be known to analytically estimate the frequency response of smoothing filter 306. In some embodiments, calibration may be used to determine the frequency response to the smoothing filter 306. The SOS control module 302 may use the frequency response of the smoothing filter 306 to take into account expected changes in magnitude, phase, or a combination thereof, that the smoothing filter 306 is expected to impose on the different frequency components of the SOS control signal 354. The SOS control module 302 may compensate for the expected changes when generating the digital SOS signal 350. In other words, the SOS control module 302 may be configured to pre-emphasize the digital SOS signal 350 to compensate for the response of the smoothing filter 306. By way of non-limiting example, if the smoothing filter 306 is expected to attenuate and shift a first frequency component of the choppy SOS signal 352 by known amounts, the SOS control module 302 may preemptively increase the magnitude and shift the phase of the corresponding first frequency component of the digital SOS signal 350 by the known amounts to compensate for the expected changes.

The signal measuring module 310 may be configured to measure electrical signals 206 at the terminals of the test battery 205. By way of non-limiting example, the signal measuring module 310 may be configured to measure a voltage response of the test battery 205 to the SOS signal, a current response of the test battery 205 to the SOS signal, or a combination thereof. The signal measuring module 310 may be configured to provide the impedance computation module 312 with measured signal data 360 indicating the measured response of the test battery 205 to the SOS signal.

The impedance computation module 312 may be configured to compute a determined impedance (impedance data 362) of the test battery 205 using the measured signal data 360 from the signal measuring module 310. By way of non-limiting example, the measured signal data 360 may include both the voltage response and the current response of the test battery 205 to the SOS current signal 356 (FIG. 2). The impedance computation module 312 may be configured to divide the voltage response by the current response for each of the plurality of different frequencies of the SOS current signal 356 to determine the impedance data 362 for each of the plurality of different frequencies.

Also by way of non-limiting example, the measured signal data 360 may include only the voltage response of the test battery 205 to the SOS current signal 356. The impedance computation module 312 may be configured to estimate the current response using the voltage response and calibration data from previous or subsequent calibrations of the control circuitry. A known calibration response may be measured by applying the SOS current signal 356 to one or more shunts of known impedance, and measuring and storing calibration data including the response of the one or more shunts to the SOS current signal 356.

The impedance computation module 312 may be configured to provide or store impedance data 362 including the determined impedance of the test battery 205 at each of the frequencies included in the digital SOS signal 350 (i.e., the same frequencies included in the choppy SOS signal 352, the SOS control signal 354, and the SOS current signal 356). In some embodiments, the impedance data 362 may be displayed to a user of the impedance measurement system 200 (FIG. 2) (e.g., on an electronic display of the impedance measurement system 200 in list form, in plot form, in table form, etc.). In some embodiments, the impedance data 362 may be processed automatically to determine whether the test battery 205 should be replaced, and the user may be informed of the automatic determination. In some embodiments, the impedance data 362 may be processed automatically to determine an estimate of how much life is remaining to the test battery 205. Such automatic processing may be performed locally by the impedance measurement system 200, remotely by a computing device (e.g., remote computer 230) configured to communicate with the impedance measurement system 200, or combinations thereof. A warning (e.g., visual, audible, or a combination thereof) may be provided when the IMB 210 detects that the test battery 205 should be replaced.

Figure 4:
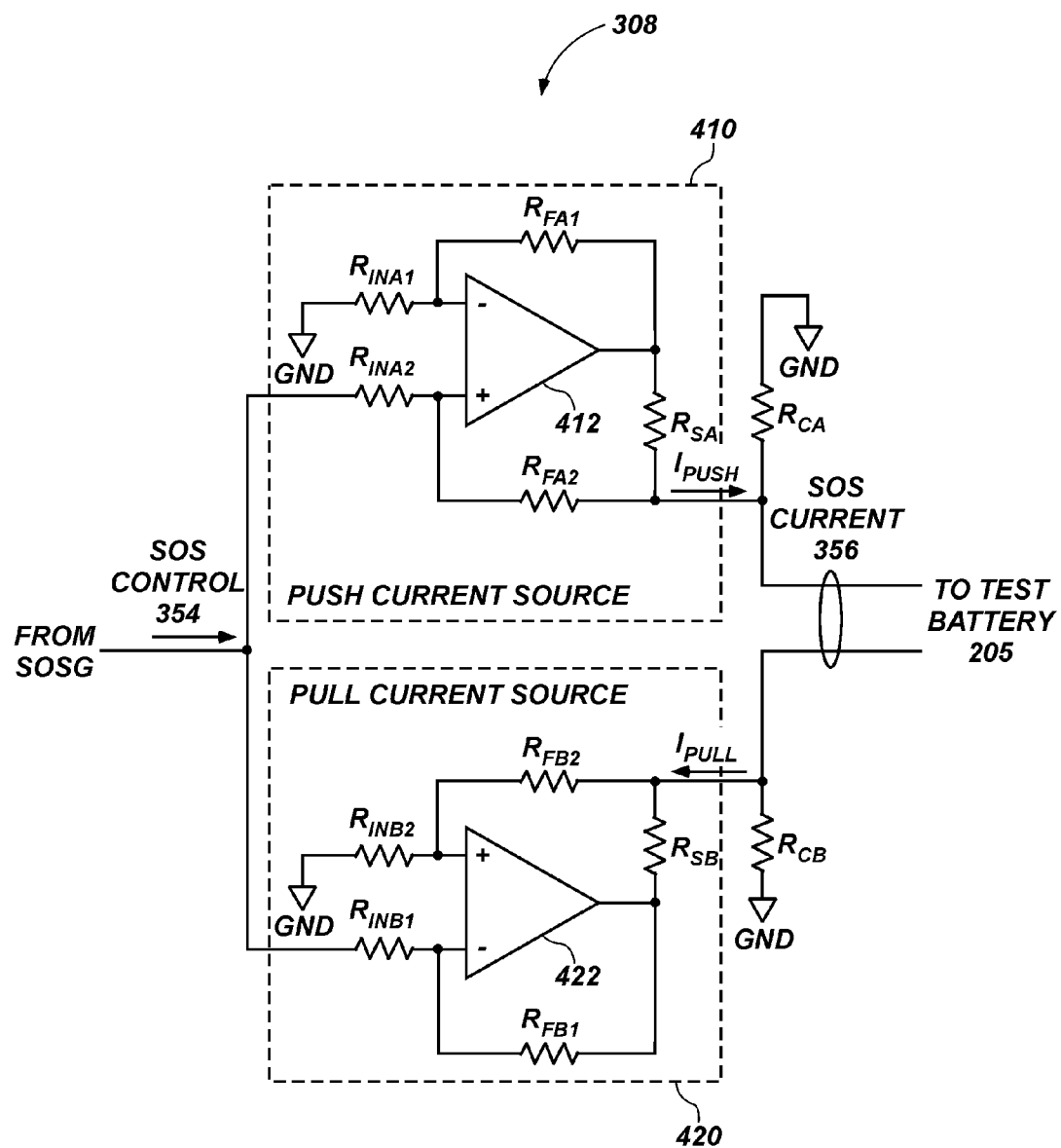
FIG. 4 is a simplified block diagram of the current driver of FIG. 3.

FIG. 4 is a simplified block diagram of the current driver 308 of FIG. 3. In some embodiments, the current driver 308 may include differential current sources including a push current source 410 and a pull current source 420 that are configured to receive the SOS control signal 354 (e.g., through the smoothing filter 306 (FIG. 3)) and generate the SOS current signal 356 provided to the test battery 205. The SOS current signal 356 may include a current signal that is proportional to a voltage potential of the SOS control signal 354. As discussed above, the SOS current signal 356 may include a sum of sinusoidal current signals having frequencies of interest for test battery 205 impedance measurements.

The push current source 410 may be configured to push current $I_{PUSH}$ into the test battery 205, and the pull current source 420 may be configured to pull current $I_{PULL}$ from the test battery 205. The analog ground terminal GND of the current driver 308 may be floated between the push current source 410 and the pull current source 420, isolating the analog ground terminal GND from the terminals of the test battery 205. The push current source 410 and the pull current source 420 may be high impedance current sources. As a result, the SOS current excitation circuitry may be fully high impedance ground isolated. As a result, the system analog ground GND may be moved to within the IMB 210 (FIG. 2) where it is better shielded from noise than in many conventional systems. In addition, the current driver voltages powering the operational amplifiers 412, 422 may be balanced (e.g., at ±30V) which may further reduce noise from the power supply 222 (FIG. 2). As a result of the balanced voltages for the current driver 308, a protector may not be necessary for protecting the current driver 308 if the test battery 205 is connected backward.

In some embodiments, the push current source 410 may include an operational amplifier 412 operably coupled to resistors $R_{INA1}$, $R_{INA2}$, $R_{FA1}$, $R_{FA2}$, and $R_{SA}$ in an operational amplifier current source configuration. Input resistors $R_{INA1}$ and $R_{INA2}$ may be operably coupled to the inverting input and the non-inverting input, respectively, of the operational amplifier 412. The non-inverting input of the operational amplifier 412 may be configured to receive the SOS control signal 354 through the resistor $R_{INA2}$. The inverting input of the operational amplifier 412 may be operably coupled to analog ground GND through resistor $R_{INA1}$. Resistors $R_{INA1}$ and $R_{INA2}$ may be selected to have the same resistance value $R_{INA}$.

The inverting input of the operational amplifier 412 may also be operably coupled to an output of the operational amplifier 412 through resistor $R_{FA1}$. The non-inverting input of the operational amplifier 412 may be operably coupled to the output of the operational amplifier 412 through resistors $R_{FA2}$ and $R_{SA}$. The resistance of $R_{FA1}$ and $R_{FA2}$ may be selected to have the same resistance value $R_{FA}$. An output of the push current source 410 may be located between resistors $R_{FA2}$ and $R_{SA}$. Accordingly, a push portion of the SOS current signal 356 may be provided between resistors $R_{FA2}$ and $R_{SA}$. Thus configured, the push portion of the SOS current signal 356 provided by the push current source 410 may be expressed as:

$$I_{PUSH} = V_{SOSCONTROL} \frac{R_{FA}}{R_{INA} R_{SA}},$$

where $I_{PUSH}$ is the current provided by the push current source 410, and $V_{SOSCONTROL}$ is the voltage potential of the SOS control signal 354. As may be seen by inspecting this expression, the $I_{PUSH}$ is proportional to $V_{SOSCONTROL}$.

In some embodiments, the pull current source 420 may include an operational amplifier 422 operably coupled to resistors $R_{INB1}$, $R_{INB2}$, $R_{FB1}$, $R_{FB2}$, and $R_{SB}$ in an operational amplifier current source configuration. Input resistors $R_{INB1}$ and $R_{INB2}$ may be operably coupled to the inverting input and the non-inverting input, respectively, of the operational amplifier 422. The inverting input of the operational amplifier 422 may be configured to receive the SOS control signal 354 through the resistor $R_{INB1}$. The non-inverting input of the operational amplifier 422 may be operably coupled to analog ground GND through resistor $R_{INB2}$. Resistors $R_{INB1}$ and $R_{INB2}$ may be selected to have the same resistance value $R_{INB}$.

The inverting input of the operational amplifier 422 may also be operably coupled to an output of the operational amplifier 422 through resistor $R_{FB1}$. The non-inverting input of the operational amplifier 412 may be operably coupled to the output of the operational amplifier 422 through resistors $R_{FB2}$ and $R_{SB}$. The resistance of $R_{FB1}$ and $R_{FB2}$ may be selected to have the same resistance value $R_{FB}$. An output of the pull current source 420 may be located between resistors $R_{FB2}$ and $R_{SB}$. Accordingly, a pull portion $I_{PULL}$ of the SOS current signal 356 may be pulled from by a node between resistors $R_{FB2}$ and $R_{SB}$. Thus configured, the pull portion $I_{PULL}$ of the SOS current signal 356 pulled by the pull current source 420 may be expressed as:

$$I_{PULL} = V_{SOSCONTROL} \frac{R_{FB}}{R_{INB} R_{SB}},$$

where $I_{PULL}$ is the current pulled by the pull current source 420, and $V_{SOSCONTROL}$ is the voltage potential of the SOS control signal 354. As is apparent from inspection of this expression, $I_{PULL}$ is proportional to $V_{SOS\ CONTROL}$. Additional details regarding a configuration including a push current source and a pull current source are described in U.S. patent application Ser. No. 14/789,959, filed Jul. 1, 2015, entitled "Apparatuses and Methods for Testing Electrochemical Cells by Measuring Frequency Response." As described previously, the disclosure of this application is incorporated in its entirety by the reference above. In some embodiments, the current driver 308 may include a single-ended current driver in place of the push-pull current driver of FIG. 4. An example of a single-ended current driver is described in United States Patent Application Publication No. 2014/0358462, filed Jun. 4, 2014, entitled "Apparatuses and Methods for Testing Electrochemical Cells by Measuring Frequency Response." As described previously, the disclosure of this application is incorporated in its entirety by the reference above.

Figure 5:
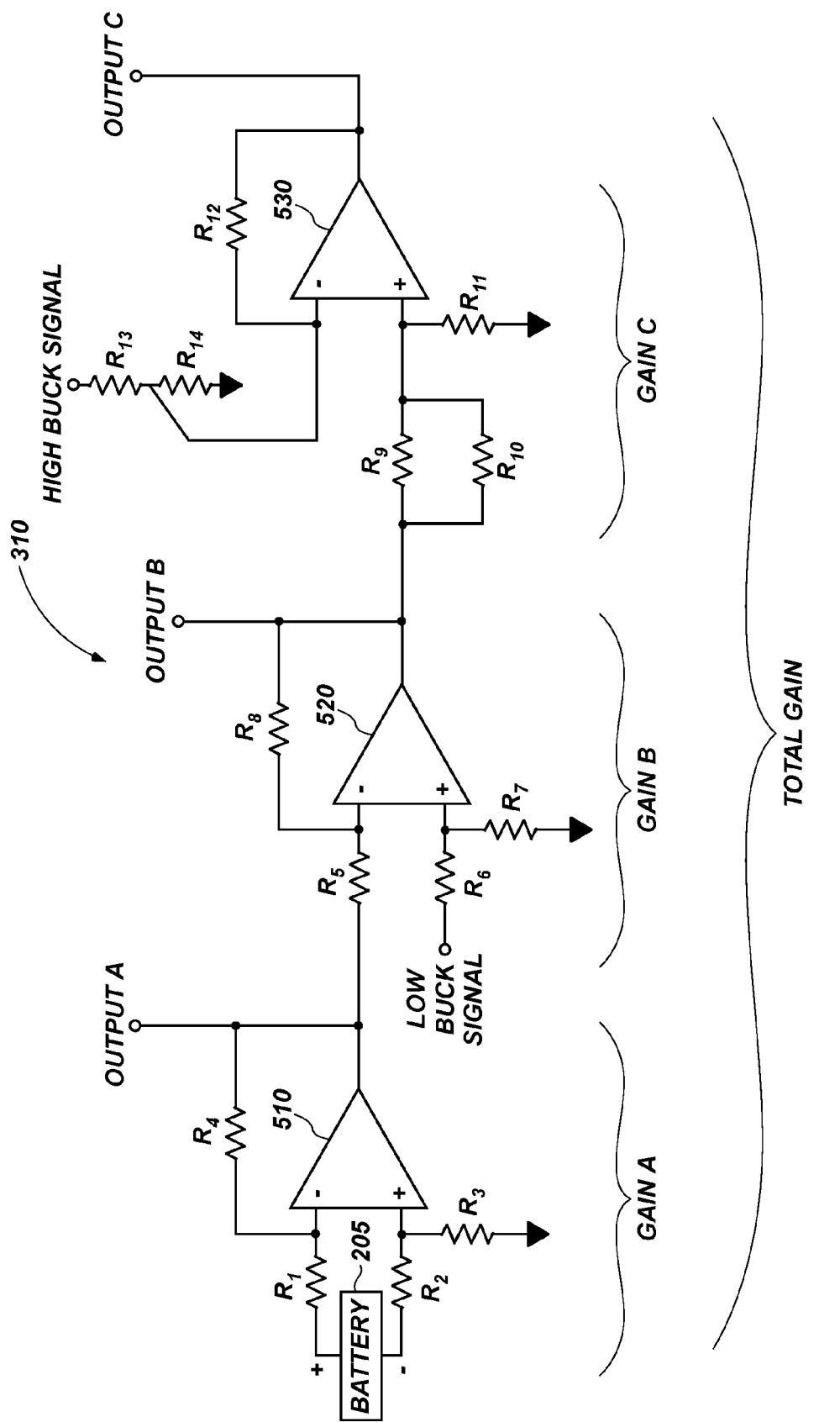
FIG. 5 illustrates a circuit diagram of the signal measuring module of the preamplifier of FIGS. 2 and 3.

FIG. 5 illustrates a circuit diagram of the signal measuring module 310 of the preamplifier 218 of FIGS. 2 and 3. The signal measuring module 310 may be suitable for use with mid-range voltage systems (e.g., approximately 50 V) as well as high-range voltage systems (e.g., approximately 300 V). Other voltage ranges are also contemplated. The signal measuring module 310 includes a plurality of operational amplifiers 510, 520, 530 operably coupled as a first gain stage (operational amplifier 510) and additional gain stages (operational amplifiers 520, 530) that cascade from the first gain stage. The first gain stage exhibits a first gain (Gain A), the second gain stage exhibits a second gain (Gain B), and the third gain stage exhibits a third gain (Gain C).

The test battery 205 may be connected to the first amplifier 510 acting as an attenuator. As shown in FIG. 5, the positive terminal of the test battery 205 may be coupled to the inverting input of the first amplifier 510 (e.g., through resistor R1), and the negative terminal of the test battery 205 may be coupled to the non-inverting input of the first amplifier 510 (e.g., through the voltage divider of resistors R2, R3). The output of the first amplifier 510 (i.e., output A) may be returned to the DAS 214 (FIG. 2). The values of resistors R1, R2, R3, and R4 may be selected for a desired Gain A. In some embodiments, Gain A is approximately −0.166.

The second amplifier 520 may be used to condition the battery voltage and set an appropriate voltage for comparison to a low buck signal received from the DAS 214. In particular, the second amplifier 520 may receive the output (i.e., output A) from the first amplifier 510 at its inverting input (e.g., through resistor R5), and the buck signal from the DAS 214 at its non-inverting input (e.g., through the voltage divider of resistors R6, R7). The output of the second amplifier 520 (i.e., output B) may be returned to the DAS 214. The values of resistors R5, R6, R7, and R8 may be selected for a desired Gain B. In some embodiments, Gain B is approximately −20 (e.g., −19.85).

The third amplifier 530 may be used to condition the battery voltage and set an appropriate voltage for comparison to a buck signal from the DAS 214. In particular, the third amplifier 530 may receive the output (i.e., output B) from the second amplifier 520 at its non-inverting input (e.g., through voltage divider of resistors R9/R10, and R11), and the buck signal from the DAS 214 at its inverting input (e.g., through the voltage divider of resistors R13, R14). The output of the third amplifier 530 (i.e., output C) may be returned to the DAS 214. The values of resistors R9, R10, R11, R12, R13, and R14 may be selected for a desired Gain C. In some embodiments, Gain C is approximately +20 (e.g., +19.95).

A Total Gain for the signal measuring module 310 may be the product of each of the Gains A, B, C. Thus, when Gain A≈−0.166, Gain B≈−20, and Gain C≈+20, the Total Gain may be approximately +66 (e.g., 66.4). The total gain may be raised in comparison to many conventional systems (that have been on the order of about 17), which increased gain (e.g., by a factor of approximately 4) may contribute to an increased sensitivity and resolution of the signal measuring module 310. Having at least two bias voltage feedback lines in the gain stages of signal measuring module 310 may enable the total gain to be increased safely.

Output A, output B, and output C may each be transmitted to the DAS 214 for feedback when generating the buck signals. The DAS 214 may be configured to adapt the generation of the buck signals responsive to the feedback received from output A, output B, and output C. The buck signals may be received from the DAS 214 at each of the second gain stage and the third gain stage of the signal measuring module 310. In particular, the second amplifier 520 may receive the low buck signal at its non-inverting input, and the third amplifier 530 may receive the high buck signal at its inverting input. As a result, the low buck signal is used to define the voltage that is compared to the output (output A) of the first amplifier 510 by the second amplifier 520 to generate its output (output B). In addition, the high buck signal is used to define the voltage that is compared to the output (output B) of the second amplifier 520 by the third amplifier 530 to generate its output (output C).

Figure 6:
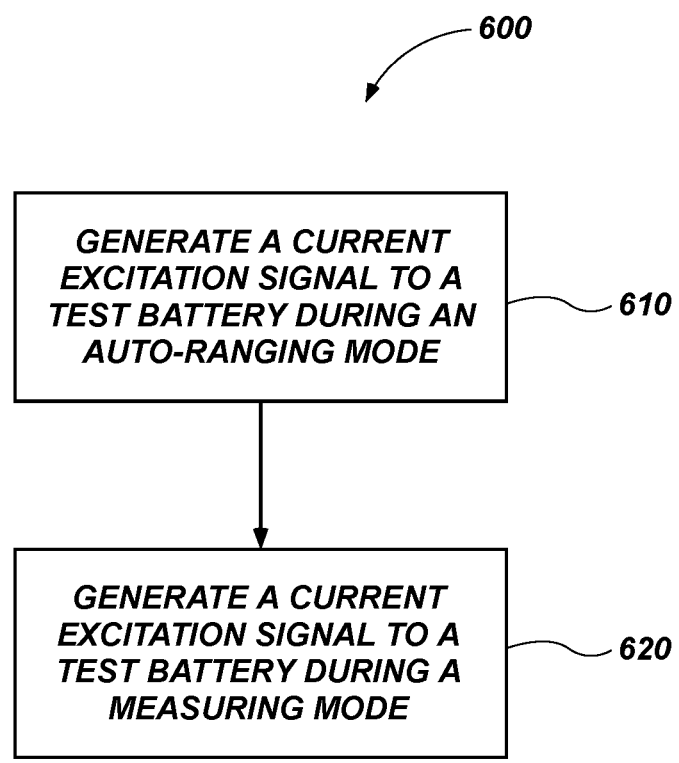
FIG. 6 is a flowchart illustrating a method for operating an impedance measurement system of a battery according to an embodiment of the present disclosure.

FIG. 6 is a flowchart 600 illustrating a method for operating an impedance measurement system of a battery according to an embodiment of the present disclosure. The impedance measurement system may operate in an auto-ranging mode and a measuring mode. The auto-ranging mode may enable the IMB to operate over a variety of batteries exhibiting a broader range of impedance. At operation 610, the IMD may perform an auto-ranging function on the test battery to determine a current amplitude to use during the measuring mode. At operation 620, the IMB may perform measurements on the test battery to determine the impedance measurements that may inform the impedance measurement system of the health of the test battery. The processor of the IMB may be configured to control the SOSG to perform auto-ranging of the current excitation signal prior to entering the measuring mode. As an example, the auto-ranging of the current excitation signal may occur after the desired buck voltage is achieved by the signal measuring module of the preamplifier, but prior to the performing impedance measurements during the measuring mode.

Referring specifically to operation 610 in view of FIG. 3, the SOSG 216 may cause the current driver 308 to generate the SOS current signal 356 as pulses of increasing or decreasing amplitudes. For example, a first pulse may exhibit a first amplitude, a second pulse may exhibit a second amplitude, a third pulse may exhibit a third amplitude, etc. In some embodiments, the amplitudes of the pulses may increase sequentially, while in other embodiments, the amplitudes of the pulses may start at a maximum and decrease sequentially. In yet other embodiments, the amplitudes may be different magnitudes, but not necessarily in a sequential order. In some embodiments, the sequence of pulses may be performed over one period of a sine wave (e.g., 100 Hz). The voltage response for these auto-ranging pulses may be analyzed by the DAS 214, which may be used to determine what SOS current level will be used during the measurement phase. In some embodiments, the DAS 214 may determine which pulse in the sequence of pulses was the last one before voltage clipping occurred in the measurement signals. In some embodiments, the pulse may be over a single period of a sine wave above 1 Hz and below the Nyquist frequency to enable rapid determination of RMS excitation current. For embodiments in which a time crosstalk compensation (TCTC) method is employed, the RMS excitation may be conservatively selected because saturation in the captured time record may corrupt the impedance measurement.

Referring specifically to operation 620 in view of FIG. 3, the processor 212 may be configured to cause the SOSG 216 to control the current driver 308 to generate SOS current signal 356 during its measuring mode based, at least in part, on the results of the auto-ranging mode. In some embodiments, the processor 212 may use settings for the SOSG 216 that caused the SOS current signal 356 having the greatest amplitude prior to voltage clipping of the battery voltage measured during the auto-ranging mode. Whereas prior conventional IMDs often had a fixed current level (e.g., 0.5 $A_{RMS}$) that was reduced in order to safely avoid voltage clipping, embodiments of the present disclosure may have a variable current level with an increased gain so that the IMD may operate more closely at its peak performance during measuring mode while still avoiding voltage clipping. As a result, the maximum possible current amplitude for the excitation current may be limited by what the hardware supports (e.g., 2 $A_{RMS}$, 3 $A_{RMS}$, 4 $A_{RMS}$, etc.) rather than being limited to a fixed value that ensures voltage clipping is avoided. Thus, the auto-ranging feature may be used to determine what current amplitude to use during measuring mode from a range of possible current amplitudes.

During measuring mode, a number of different data processing methods may be employed to determine the impedance of the test battery 205 from the electrical signals 206 (FIG. 2). As an example, the data processing method used by the DAS 214 may include a time crosstalk compensation (TCTC) method, such as for example, is described in U.S. Pat. No. 8,762,109, issued Jun. 24, 2014, entitled "Crosstalk Compensation in Analysis of Energy Storage Devices." In some embodiments, the data processing method used by the DAS 214 may include a HOST method, such as for example, is described in U.S. patent application Ser. No. 14/789,959, filed Jul. 1, 2015, entitled "Apparatuses and Methods for Testing Electrochemical Cells by Measuring Frequency Response." As described previously, the disclosure of this application is incorporated in its entirety by the reference above. In some embodiments, a Fast Summation Transformation (FST) method, disclosed in U.S. Pat. No. 8,150,643, issued Apr. 3, 2012, and entitled "Method of Detecting System Function by Measuring Frequency Response." In some embodiments, the data processing method used by the DAS 214 may include a triads based Generalized Fast Summation Transformation (GFST) method described in U.S. Pat. No. 8,352,204, issued Jan. 8, 2013, entitled "Method of Detecting System Function by Measuring Frequency Response." The disclosure of each of the foregoing applications is hereby incorporated in their entirety by this reference. Other methods are also contemplated, including modified TCTC and HOST methods.

The data processing method may be configured to be tolerant of over-range saturation. For example, the captured time record for battery voltage may be examined for signal saturation and any samples within that voltage time record that are either above or below the full scale voltage may be discarded. Additionally, within the current time record, the same condition may be applied to discarded samples within the current time record that are either above or below the full scale current. As a result, the data processing method may be configured to compensate for deleted data points.

As an example, some of the data processing methods are based upon an SOS signal with a frequency spread that is octave harmonic (e.g., HOST). With such a HOST method, the frequency spread was harmonic over a decade as follows: 1, 2, 3, 4, 5, 7, 9. In some embodiments, a HOST method may alternate between sine and cosine between frequencies, which provides an extra level of orthogonality between frequencies. In addition, if both voltage and current time records were acquired and processed into the frequency domain using the HOST method, the ratio of voltage response to the current response at a specific frequency is the impedance at that frequency. Thus, the measurement using the HOST method may be self-calibrated and, since both measurements have responded to the same smoothing filter, pre-emphasis of the smoothing filter may also not be required.

As discussed above, the HOST method may employ a sum of alternating sines, cosines (ASC) signal instead of a pure SOS signal. If the frequency spread over a measurement decade is excessively fine, the signal to noise ratio (SNR) may be the signal power divided up amongst a large number of frequencies, which may result in a lowered signal to noise ratio for each frequency. For the derivation of these methods, it may be assumed: a given number, M, and spread of frequencies, $f_K$ where $f_M \leq 2000$ Hz. For a HOST method, with an ASC current signal used to excite the test battery, the current excitation signal is given by Equation (1).

$$I_{ASC}(i\Delta t) = \sum_{j=1}^{M/2} I_P \sin(2\pi f_{2j} i\Delta t) + I_P \cos(2\pi f_{2j-1} i\Delta t) \tag{1}$$

where: $I_P$ is the peak current at each frequency, $\Delta t$ is the sample time step, and $I_{ASC}$ is the computer generated current. The captured current time record is given by Equation (2a) and the captured voltage time record is given by Equation (2b).

$$R_I(i\Delta t) = \tag{2a}$$
$$R_{IO} + \sum_{j=1}^{M/2} I_{2j}\sin(2\pi f_{2j} i\Delta t + \phi_{I2j}) + I_{2j-1}\cos(2\pi f_{2j-1} i\Delta t + \phi_{I2j-1})$$

where: $R_{IO}$ accounts for any DC offset in the current measurement system, $I_{2j}$ is the amplitude of the $f_{2j}$ sine frequency, $I_{2j-1}$ is the amplitude of the $f_{2j-1}$ cosine frequency, $\phi_{I2j}$ is the phase of the $f_{2j}$ sine frequency, and $\phi_{2j-1}$ is the phase of the $f_{2j-1}$ cosine frequency.

$$R_V(i\Delta t) = \tag{2b}$$
$$R_{VO} + \sum_{j=1}^{M/2} V_{2j}\cos(2\pi f_{2j} i\Delta t + \phi_{V2j}) + V_{2j-1}\sin(2\pi f_{2j-1} i\Delta t + \phi_{V2j-1})$$

where: $R_{VO}$ accounts for any DC offset in the voltage measurement system, $V_{2j}$ is the amplitude of the $f_{2j}$ sine frequency, $V_{2j-1}$ is the amplitude of the $f_{2j-1}$ cosine frequency, $\phi_{V2j}$ is the phase of the $f_{2j}$ sine frequency, and $\phi_{2j-1}$ is the phase of the $f_{2j-1}$ cosine frequency.

Equation (2a) and Equation (2b) may be solved as Equation (3) for a generic time record:

$$R(i\Delta t) = \tag{3}$$
$$R_o + \sum_{j=1}^{M/2} A_{2j}\cos(2\pi f_{2j} i\Delta t + \phi_{2j}) + A_{2j-1}\sin(2\pi f_{2j-1} i\Delta t + \phi_{2j-1})$$

$$R(i\Delta t) = R_o + \sum_{j=1}^{M/2} A_{2j}\cos\phi_{2j}(2\pi f_{2j} i\Delta t) - A_{2j}\sin\phi_{2j}(2\pi f_{2j} i\Delta t) +$$
$$A_{2j-1}\cos\phi_{2j-1}\sin(2\pi f_{2j-1} i\Delta t) + A_{2j-1}\sin\phi_{2j-1}\sin S(2\pi f_{2j-1} i\Delta t)$$

which may be converted into matrix form and further simplified as:

$$[R]_{N\times 1} = [A]_{N\times(2M+1)} \times [UK]_{(2M+1)\times 1} \quad (4)$$

$$[UK]_{(2M+1)\times 1} = \{[A]'_{(2M+1)\times N} \times [A]_{N\times(2M+1)}\}^{-1}_{(2M+1)\times(2M+1)} \times [A]'_{(2M+1)\times N} \times [R]_{N\times 1}$$

where:

$$[R] = \underbrace{\begin{bmatrix} R(\Delta t) \\ \cdot \\ \cdot \\ \cdot \\ R(N\Delta t) \end{bmatrix}_{N\times 1}}_{[R]} = [A] \times [UK],$$

and where:

$[A] =$ $$\underbrace{\begin{bmatrix} 1 & \sin(2\pi f_1 \Delta t) & \cos(2\pi f_1 \Delta t) & \cos(2\pi f_2 \Delta t) & -\sin(2\pi f_2 \Delta t) & \cdots \\ \vdots & & & & & \\ 1 & \sin(2\pi f_1 N\Delta t) & \cos(2\pi f_1 N\Delta t) & \cos(2\pi f_2 N\Delta t) & -\sin(2\pi f_2 N\Delta t) & \cdots \\ \cdots & \sin(2\pi f_{M-1} \Delta t) & \cos(2\pi f_{M-1} \Delta t) & \cos(2\pi f_M \Delta t) & -\sin(2\pi f_M \Delta t) \\ & & & & \vdots \\ \cdots & \sin(2\pi f_{M-1} N\Delta t) & \cos(2\pi f_{M-1} N\Delta t) & \cos(2\pi f_M N\Delta t) & -\sin(2\pi f_M N\Delta t) \end{bmatrix}}_{A} \times$$

$$[UK] = \underbrace{\begin{bmatrix} R_O \\ A_1 \cos\phi_1 \\ A_1 \sin\phi_1 \\ A_2 \cos\phi_2 \\ A_2 \sin\phi_2 \\ \vdots \\ A_{M-1}\cos\phi_{M-1} \\ A_{M-1}\sin\phi_{M-1} \\ A_M \cos\phi_M \\ A_M \sin\phi_M \end{bmatrix}}_{UK}.$$

40

Equation (4) may then be used to solve Equations (2a) and (2b), which may result in a battery impedance at the ith frequency that is approximately:

$$Z_i = \frac{V_i \cos\phi_{Vi} + jV_i \sin\phi_{Vi}}{I_i \cos\phi_{Ii} + jI_i \sin\phi_{Ii}}. \quad (5)$$

Equation (4) may operate with samples from the captured time record discarded when the samples are at plus or minus the full scale voltage or current if the N remaining samples are such that N>(2M+1). In some embodiments, a third order Butterworth low-pass filter may be chosen for the smoothing filter (FIG. 3), which may result in the following transfer function H(s) for the low-pass filter:

$$H(s) = \frac{1}{\left(\frac{s}{2\pi}\right)^2 + 1.4142\left(\frac{s}{2\pi}\right) + 1}. \quad (6)$$

An excitation current signal may be selected with a Nyquist frequency greater than the highest frequency (e.g., 2 kHz) within the excitation current signal. With the frequency for the excitation current selected, the amplitude for the excitation current signal may be selected based on the analysis performed during the auto-ranging mode. The excitation current signal may then be used during the measuring mode with the increased gain described above with respect to FIG. 5.

As a result of the combination of excitation current amplitude increase and the gain increase, the sensitivity and resolution may be improved over existing IMDs. The improvement in sensitivity and resolution may be by a factor of approximately 10 to 15 based on preliminary testing. As a result of the features discussed herein, the IMB may be configured to measure the internal impedance of high power battery cells exhibiting low impedance (e.g., between about 1 mOhm to 5 mOhm, less than about 1 mOhm, etc.) while also maintaining a high resolution (e.g., at least about 0.01 mOhm) with rapid measurements (e.g., 10 seconds or less). Such characteristics are improvements over conventional methods using IMDs (having resolution limitations for low impedances) as well as those using Electrochemical Impedance Spectroscopy (having slow measurements).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed by the disclosure.

What is claimed is:

1. An impedance measurement device, comprising:
a current driver configured to generate an excitation current signal to be applied to a test battery responsive to a control signal; and
a processor operably coupled with the current driver, the processor configured to generate the control signal during an auto-ranging mode and a measuring mode, wherein:
the auto-ranging mode applies the excitation current signal to the test battery over a plurality of different amplitudes to measure a response to the excitation current signal at each amplitude; and
the measuring mode:
applies the excitation current signal to the test battery for an amplitude responsive to results of the auto-ranging mode; and
captures at least one of a voltage time record and a current time record, and discard samples within the voltage and current time records that are either above or below a full scale for a respective time record.

2. The impedance measurement device of claim 1, further comprising a pre-amplifier including the current driver and a signal measuring module configured to measure electrical signals responsive to the excitation current signal being applied to the test battery.

3. The impedance measurement device of claim 1, wherein the current driver is configured to generate at least one of a sum-of-sinusoids (SOS) current signal or a sum of alternating sines, cosines (ASC) signal.

4. The impedance measurement device of claim 1, wherein the current driver includes differential current sources including a pull up current source and a pull down current source operably coupled to the test battery.

5. An impedance measurement device, comprising:
a current driver exhibiting a total gain of greater than approximately 20 and configured to generate an excitation current signal to be applied to a test battery responsive to a control signal; and
a processor operably coupled with the current driver, the processor configured to generate the control signal during an auto-ranging mode and a measuring mode, wherein:
the auto-ranging mode applies the excitation current signal to the test battery over a plurality of different amplitudes to measure a response to the excitation current signal at each amplitude; and
the measuring mode applies the excitation current signal to the test battery for an amplitude responsive to results of the auto-ranging mode.

6. The impedance measurement device of claim 5, wherein the total gain is greater than approximately 60.

7. An impedance measurement device, comprising:
a current driver configured to generate an excitation current signal to be applied to a test battery responsive to a control signal; and
a processor operably coupled with the current driver, the processor configured to generate the control signal during an auto-ranging mode and a measuring mode, wherein:
the auto-ranging mode applies the excitation current signal to the test battery over a plurality of different amplitudes to measure a response to the excitation current signal at each amplitude; and
the measuring mode applies the excitation current signal to the test battery for an amplitude responsive to results of the auto-ranging mode; and
wherein the current driver includes at least three cascading gain stages with outputs from each cascading gain stage being fed back to the processor to determine a plurality of buck voltages transmitted back from the processor to the current driver.

8. The impedance measurement device of claim 7, wherein the at least three cascading gain stages include a first gain stage exhibiting a first gain of approximately −0.166, a second gain stage exhibiting a second gain of approximately −20, and a third gain stage exhibiting a third gain of approximately 20.

9. An impedance measurement system, comprising:
a test battery; and
an impedance measurement device operably coupled to the test battery, wherein the impedance measurement device includes:
a preamplifier including a current driver and a signal measuring module operably coupled with the test battery, wherein the current driver includes at least one gain stage with an output being fed back to a processor to determine a buck voltage that is transmitted back from the processor to the current driver;
a current control signal generator operably coupled with the preamplifier;
a data acquisition system operably coupled with the preamplifier; and
the processor operably coupled with the current control signal generator and the data acquisition system, wherein the processor is configured to determine the buck voltage applied to the test battery through the current driver and after the buck voltage is applied the processor is further configured to:
control the current control signal generator to transmit a current control signal to the preamplifier during an auto-ranging mode to cause the current driver to generate an excitation current signal exhibiting a range of amplitudes;
control the data acquisition system to analyze a response of the test battery from the signal measuring module during the auto-ranging mode;
control the current control signal generator to transmit the current control signal to the preamplifier during a measuring to cause the current driver to generate the excitation current signal exhibiting a selected amplitude based, at least in part, on analyzing the response of the test battery during the auto-ranging mode; and
control the data acquisition system to analyze the response of the test battery from the signal measuring module during the measuring mode to determine an impedance of the test battery.

10. The impedance measurement system of claim 9, wherein the battery includes one or more energy storage cells.

11. An impedance measurement system, comprising:
a test battery; and an impedance measurement device operably coupled to the test battery, wherein the impedance measurement device includes:
- a preamplifier including a current driver and a signal measuring module operably coupled with the test battery;
- a current control signal generator operably coupled with the preamplifier;
- a data acquisition system operably coupled with the preamplifier; and
- a processor operably coupled with the current control signal generator and the data acquisition system, wherein the processor is configured to:
  - control the current control signal generator to transmit a current control signal to the preamplifier during an auto-ranging mode to cause the current driver to generate an excitation current signal exhibiting a range of amplitudes;
  - control the data acquisition system to analyze a response of the test battery from the signal measuring module during the auto-ranging mode;
  - control the current control signal generator to transmit the current control signal to the preamplifier during a measuring to cause the current driver to generate the excitation current signal exhibiting a selected amplitude based, at least in part, on analyzing the response of the test battery during the auto-ranging mode; and
  - control the data acquisition system to analyze the response of the test battery from the signal measuring module during the measuring mode to determine an impedance of the test battery; and
- wherein at least one of the processor and the data acquisition system includes an impedance computation module that executes a data processing method to determine the impedance of the test battery, wherein the data processing method is configured to capture at least one of a voltage time record or a current time record, and to discard samples within the voltage or current time records that are either above or below a full scale for a respective time record.

12. The impedance measurement system of claim 11, wherein the data acquisition system includes an impedance computation module that executes the data processing method to determine the impedance of the test battery, wherein the data processing method is selected from the group consisting of a time crosstalk compensation (TCTC) method, a harmonic orthogonal synchronous transform (HOST) method, a Fast Summation Transformation (FST) method, and a triads based Generalized Fast Summation Transformation (GFST) method.

13. The impedance measurement system of claim 11, further comprising a remote computer operably coupled with the impedance measurement device, the remote computer configured to control the impedance measurement device and receive impedance data from the impedance measurement device.

14. The impedance measurement system of claim 11, wherein the preamplifier further includes a smoothing filter operably coupled between the current control signal generator and the current driver.

15. The impedance measurement system of claim 11, wherein the excitation current signal includes at least one of a sum-of-sinusoids (SOS) current signal or a sum of alternating sines, cosines (ASC) signal for each of the auto-ranging mode and the measuring mode.

16. The impedance measurement system of claim 11, wherein the test battery exhibits an internal impedance between about 1 mOhm and 5 mOhm.

17. The impedance measurement system of claim 16, wherein the impedance measurement device exhibits a resolution of at least 0.01 mOhm with a measurement time of about 10 seconds or less.

18. The impedance measurement system of claim 11, further comprising a vehicle including the test battery.

19. The impedance measurement system of claim 18, wherein the vehicle further includes the impedance measurement device.

20. A method of measuring impedance of a test battery, the method comprising:
- applying an excitation current signal to a test battery including a plurality of pulses exhibiting different amplitudes during an auto-ranging mode;
- measuring an electrical signal from the test battery responsive to the excitation current signal over the plurality of different amplitudes;
- applying the excitation current signal to the test battery exhibiting a fixed amplitude during a measuring mode, wherein the fixed amplitude is set based, at least in part, on an analysis of the electrical signal measured during the auto-ranging mode; and
- measuring the electrical signal from the test battery responsive to the excitation current signal exhibiting the fixed amplitude during the measuring mode to determine an internal impedance of the test battery, wherein measuring the electrical signal during the measuring mode further comprises capturing at least one of a voltage time record and a current time record, and discarding samples within the voltage and current time records that are either above or below a full scale for a respective time record.

21. The method of claim 20, wherein the fixed amplitude corresponds to an amplitude within the plurality of pulses that is at least one pulse before voltage clipping was determined to have occurred in the electrical signal during the auto-ranging mode.

22. The method of claim 20, wherein applying the excitation current signal to the test battery includes applying the excitation current signal to the test battery exhibiting an average mid-range voltage between about 40 V to 60 V or about 250 V to 350 V.

23. A method of measuring impedance of a test battery, the method comprising:
- during an auto-ranging mode:
  - applying an excitation current signal to a test battery including a sequence of pulses exhibiting different amplitudes, wherein the sequence of pulses is applied over a single period of a sine wave above about one Hertz and below a Nyquist frequency of a largest frequency in a sum-of-sines excitation current signal;
  - measuring an electrical signal from the test battery responsive to the excitation current signal over the different pulse amplitudes; and
  - performing an analysis process of the electrical signal from the test battery with a computer processor to determine a suitable fixed amplitude for the sum-of-sines excitation current signal; and
- during a measuring mode:
  - applying the sum-of-sines excitation current signal with the fixed amplitude to the test battery; and
  - measuring the electrical signal from the test battery responsive to the sum-of-sines excitation current signal exhibiting the fixed amplitude to determine an internal impedance of the test battery.

24. A method of measuring impedance of a battery, the method comprising:
during an auto-ranging mode:
applying an excitation signal to the battery including a plurality of pulses exhibiting different amplitudes; and
measuring a response signal from the battery responsive to the excitation signal over the plurality of different amplitudes; and
during a measuring mode, enabling increased sensitivity and resolution of measurements by:
determining a largest amplitude supported by the battery before signal clipping occurs by analyzing the response signal to determine an amplitude of at least one pulse of the plurality having a largest amplitude before the signal clipping occurred in the response signal during the auto-ranging mode;
setting a measuring-mode amplitude based, at least in part, on the determined largest amplitude supported by the battery;
applying the excitation signal with the measuring-mode amplitude to the battery;
measuring a response signal from the battery responsive to the excitation signal by capturing at least one of a voltage time record and a current time record; and
enabling the measuring mode to be tolerant of over-range saturation by discarding one or more samples within at least one of the voltage time record and the current time record that are either above or below a full scale for a respective time record.

25. The method of claim 24, wherein:
measuring the response signal further comprises capturing the voltage time record and the current time record; and
discarding the one or more samples further comprises discarding the same one or more samples within the voltage time record and the current time record; and
further comprising determining the impedance of the battery using the voltage time record and the current time record without the discarded one or more samples.

26. The method of claim 24, wherein:
measuring the response signal further comprises capturing only the voltage time record; and
discarding the one or more samples further comprises discarding the one or more samples within the voltage time record; and
further comprising:
calibrating a data acquisition system prior to the auto-ranging mode and the measuring mode with a calibration time record such that the voltage time record is sufficient for determining the impedance of the battery; and
determining the impedance of the battery using both the calibration and voltage time records without the same discarded one or more samples.

* * * * *

UNITED STATES PATENT AND TRADEMARK OFFICE
CERTIFICATE OF CORRECTION

PATENT NO. : 10,345,384 B2  
APPLICATION NO. : 15/060183  
DATED : July 9, 2019  
INVENTOR(S) : Jon P. Christophersen, William H. Morrison and John L. Morrison Page 1 of 1

It is certified that error appears in the above-identified patent and that said Letters Patent is hereby corrected as shown below:

In the Specification

| | | |
|---|---|---|
| Column 9, | Line 13, | change "of the IMB" to --of the IMD-- |
| Column 11, | Line 13, | change "when the IMB" to --when the IMD-- |
| Column 11, | Line 39, | change "within the IMB" to --within the IMD-- |
| Column 14, | Line 17, | change "enable the IMB" to --enable the IMD-- |
| Column 14, | Line 21, | change "the IMB may" to --the IMD may-- |
| Column 14, | Line 25, | change "of the IMB" to --of the IMD-- |
| Column 16, | Line 21, | change "$I_P$is the peak" to --$I_P$ is the peak-- |
| Column 18, | Line 52, | change "the IMB may be" to --the IMD may be-- |

Signed and Sealed this  
Seventeenth Day of September, 2019

Andrei Iancu  
*Director of the United States Patent and Trademark Office*